(12) United States Patent
Pi et al.

(10) Patent No.: US 11,545,616 B2
(45) Date of Patent: Jan. 3, 2023

(54) MAGNETIC MEMORY DEVICE AND METHOD FOR MANUFACTURING THE SAME

(71) Applicant: Samsung Electronics Co., Ltd., Suwon-si (KR)

(72) Inventors: Ung Hwan Pi, Hwaseong-si (KR); Dongkyu Lee, Suwon-si (KR)

(73) Assignee: Samsung Electronics Co., Ltd.

( * ) Notice: Subject to any disclaimer, the term of this patent is extended or adjusted under 35 U.S.C. 154(b) by 196 days.

(21) Appl. No.: 16/893,594

(22) Filed: Jun. 5, 2020

(65) Prior Publication Data
US 2021/0098686 A1    Apr. 1, 2021

(30) Foreign Application Priority Data
Oct. 1, 2019  (KR) .................. 10-2019-0121627

(51) Int. Cl.
| | | |
|---|---|---|
| *H01L 43/02* | (2006.01) | |
| *G11C 11/16* | (2006.01) | |
| *H01L 43/10* | (2006.01) | |
| *H01L 27/22* | (2006.01) | |
| *H01F 41/34* | (2006.01) | |
| *H01L 43/12* | (2006.01) | |
| *H01F 10/32* | (2006.01) | |

(52) U.S. Cl.
CPC .......... *H01L 43/02* (2013.01); *G11C 11/161* (2013.01); *G11C 11/1673* (2013.01); *G11C 11/1675* (2013.01); *H01F 10/329* (2013.01); *H01F 10/3254* (2013.01); *H01F 41/34* (2013.01); *H01L 27/222* (2013.01); *H01L 43/10* (2013.01); *H01L 43/12* (2013.01)

(58) Field of Classification Search
CPC ..... H01L 43/02; H01L 27/222; G11C 11/161; H01F 10/3254
See application file for complete search history.

(56) References Cited

U.S. PATENT DOCUMENTS

| | | |
|---|---|---|
| 7,525,862 B1 | 4/2009 | Sun et al. |
| 7,872,906 B2 | 1/2011 | Miura et al. |
| 8,115,238 B2 | 2/2012 | Lim et al. |
| 8,681,542 B2 | 3/2014 | Hwang |
| 9,502,090 B2 | 11/2016 | Lew et al. |
| 10,008,350 B2 | 6/2018 | Quinsat et al. |

(Continued)

FOREIGN PATENT DOCUMENTS

KR    10-2012-0021784    3/2012

OTHER PUBLICATIONS

Samuel J. Ling et al., University Physics vol. 2, OpenStax, Rice University, 2018, pp. 560-566 (Year: 2018).*

*Primary Examiner* — Shih Tsun A Chou
(74) *Attorney, Agent, or Firm* — Myers Bigel, P.A.

(57) ABSTRACT

A magnetic memory device includes a conductive line extending in a first direction, a magnetic line extending in a second direction intersecting the first direction on the conductive line, the magnetic line intersecting the conductive line, and a magnetic pattern disposed between the conductive line and the magnetic line. The magnetic pattern has first sidewalls opposite to each other in the first direction, and second sidewalls opposite to each other in the second direction. The second sidewalls of the magnetic pattern are aligned with sidewalls of the conductive line, respectively.

22 Claims, 35 Drawing Sheets

(56) References Cited

U.S. PATENT DOCUMENTS

| | | |
|---|---|---|
| 10,164,168 B2 | 12/2018 | Sandhu et al. |
| 2008/0054385 A1* | 3/2008 | Klostermann ........ H01L 27/222 |
| | | 257/E27.005 |
| 2011/0275197 A1 | 11/2011 | Park et al. |
| 2020/0136027 A1* | 4/2020 | Wu ....................... H01L 27/228 |

* cited by examiner

MAGNETIC MEMORY DEVICE AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2019-0121627, filed on Oct. 1, 2019, in the Korean Intellectual Property Office, the disclosure of which is hereby incorporated by reference in its entirety.

FIELD

Embodiments of the inventive concepts relate to a magnetic memory device and, more particularly, to a magnetic memory device using a movement phenomenon of a magnetic domain wall and a method for manufacturing the same.

BACKGROUND

High-speed and low-voltage memory devices may be used to satisfy demand for high-speed and low-power electronic devices including memory devices. A magnetic memory device has been studied as a memory device satisfying this demand. Magnetic memory devices have become candidates for next-generation memory device because of their high-speed operation characteristics and/or non-volatile characteristics. In particular, magnetic memory devices using a movement phenomenon of a magnetic domain wall of a magnetic material have been studied and developed.

SUMMARY

Embodiments of the inventive concepts may provide a magnetic memory device capable of improving an integration density and a method for manufacturing the same.

Embodiments of the inventive concepts may also provide a magnetic memory device suitable for mass production and a method for manufacturing the same.

In some embodiments, a magnetic memory device may include a conductive line extending in a first direction, a magnetic line extending in a second direction intersecting the first direction on the conductive line, the magnetic line intersecting the conductive line, and a magnetic pattern between the conductive line and the magnetic line. The magnetic pattern may have first sidewalls opposite to each other in the first direction, and second sidewalls opposite to each other in the second direction. The second sidewalls of the magnetic pattern may be aligned with opposing sidewalls of the conductive line, respectively.

In some embodiments, a magnetic memory device may include a first conductive line extending in a first direction, a first magnetic line extending in a second direction intersecting the first direction on the first conductive line, the first magnetic line intersecting the first conductive line, a first magnetic pattern between the first conductive line and the first magnetic line, a second conductive line extending in parallel to the first magnetic line along the second direction on the first magnetic line, a second magnetic line extending in the first direction on the second conductive line and intersecting the second conductive line, and a second magnetic pattern between the second conductive line and the second magnetic line. The second conductive line may be vertically spaced apart from the first magnetic line, and the first conductive line and the second conductive line may be non-magnetic.

In some embodiments, a magnetic memory device may include conductive lines extending in a first direction and spaced apart from each other in a second direction intersecting the first direction, magnetic lines extending in the second direction on the conductive lines and spaced apart from each other in the first direction, the magnetic lines intersecting the conductive lines, magnetic patterns disposed at intersections of the conductive lines and the magnetic lines, respectively, and tunnel barrier lines disposed between the conductive lines and the magnetic lines, extending in the second direction and spaced apart from each other in the first direction. Each of the tunnel barrier lines may be disposed between a corresponding one of the magnetic lines and corresponding ones of the magnetic patterns. Each of the magnetic patterns may have first sidewalls opposite to each other in the first direction, and second sidewalls opposite to each other in the second direction. The second sidewalls of each of the magnetic patterns may be aligned with sidewalls of a corresponding one of the conductive lines.

In some embodiments, a method for manufacturing a magnetic memory device may include forming a conductive line and a preliminary magnetic pattern which are sequentially stacked on a substrate and extend in a first direction, forming a first interlayer insulating layer on the conductive line and the preliminary magnetic pattern, forming a tunnel barrier layer and a magnetic layer which are sequentially stacked on the first interlayer insulating layer, forming a mask pattern extending in a second direction intersecting the first direction on the magnetic layer, and performing an etching process of etching the magnetic layer, the tunnel barrier layer, the first interlayer insulating layer and the preliminary magnetic pattern by using the mask pattern as an etch mask. The conductive line may be used as an etch stop layer in the etching process.

BRIEF DESCRIPTION OF THE DRAWINGS

The inventive concepts will become more apparent in view of the attached drawings and accompanying detailed description.

DETAILED DESCRIPTION OF EMBODIMENTS

Hereinafter, embodiments of the inventive concepts will be described in detail with reference to the accompanying drawings.

Figure 1:
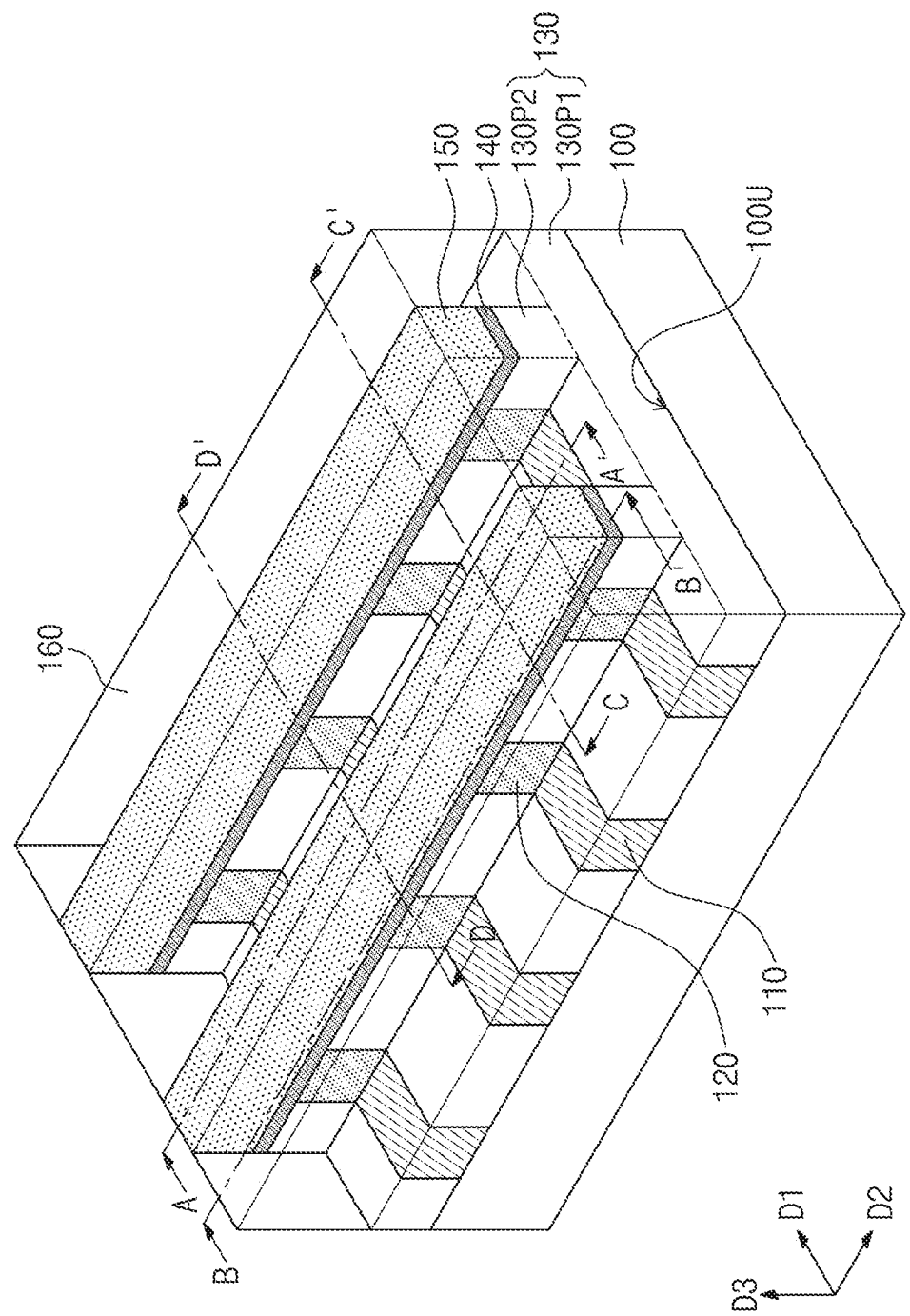
FIG. 1 is a perspective view schematically illustrating a magnetic memory device according to some embodiments of the inventive concepts.

FIG. 1 is a perspective view schematically illustrating a magnetic memory device according to some embodiments of the inventive concepts. FIGS. 2A, 2B, 2C and 2D are cross-sectional views taken along lines A-A', B-B', C-C' and D-D' of FIG. 1, respectively. FIGS. 2E and 2F are enlarged views of a portion 'PP' of FIG. 2A.

Referring to FIGS. 1 and 2A to 2D, a plurality of conductive lines 110 may be disposed on a substrate 100. The conductive lines 110 may extend in a first direction D1 and may be spaced apart from each other in a second direction D2 intersecting the first direction D1. An element extending in a direction may refer to a longitudinal direction of extension of the element. The terms first, second, etc., are used herein to distinguish one element or direction from another rather than for purposes of limitation, and a first element discussed herein could be termed a second element without departing from the scope of the present inventive concepts. The first direction D1 and the second direction D2 may be parallel to a top surface 100U of the substrate 100. The substrate 100 may include a semiconductor substrate. For example, the substrate 100 may include a semiconductor substrate that includes silicon, silicon on an insulator (SOI), silicon-germanium (SiGe), germanium (Ge), or gallium-arsenic (GaAs). The conductive lines 110 may be non-magnetic and may include a non-magnetic metal. The conductive lines 110 may include a metal (e.g., copper, tungsten, or aluminum) and/or a metal nitride (e.g., tantalum nitride, titanium nitride, or tungsten nitride).

A plurality of magnetic lines 150 may be disposed on the conductive lines 110 and may intersect the conductive lines 110. The magnetic lines 150 may extend in the second direction D2 and may be spaced apart from each other in the first direction D1. The magnetic lines 150 may be vertically spaced apart from the conductive lines 110 in a third direction D3 perpendicular to the top surface 100U of the substrate 100.

Each of the magnetic lines 150 may include a plurality of magnetic domains D and a plurality of magnetic domain walls DW. In each of the magnetic lines 150, the magnetic domains D and the magnetic domain walls DW may be alternately and repeatedly arranged in the second direction D2. Each of the magnetic domains D may be a region in a magnetic body, in which a magnetization direction is uniform. Each of the magnetic domain walls DW may be a region between the magnetic domains D in the magnetic body, in which a magnetization direction changes. Here, the magnetic body may be each of the magnetic lines 150. Each of the magnetic domain walls DW may define a boundary between the magnetic domains D having different magnetization directions. Sizes and magnetization directions of the magnetic domains D may be appropriately controlled by a shape and/or a size of the magnetic body and external energy. The magnetic domain walls DW may move by a magnetic field or current applied to the magnetic body. The magnetic lines 150 may include at least one of cobalt (Co), iron (Fe), or nickel (Ni).

A plurality of magnetic patterns 120 may be disposed between the conductive lines 110 and the magnetic lines 150 and may be located at intersection points or respective intersections of the conductive lines 110 and the magnetic lines 150, respectively. The magnetic patterns 120 may be two-dimensionally arranged in the first direction D1 and the second direction D2. Each of the magnetic patterns 120 may be electrically connected to a corresponding one of the conductive lines 110. The magnetic patterns 120 may include at least one of cobalt (Co), iron (Fe), or nickel (Ni).

A plurality of tunnel barrier lines 140 may be disposed between the conductive lines 110 and the magnetic lines 150 and may intersect the conductive lines 110. The tunnel barrier lines 140 may extend in the second direction D2 and may be spaced apart from each other in the first direction D1. Each of the tunnel barrier lines 140 may be disposed between a corresponding one of the magnetic lines 150 and corresponding ones of the magnetic patterns 120. The corresponding magnetic patterns 120 may be spaced apart from each other in the second direction D2 and may be connected to the conductive lines 110, respectively. The tunnel barrier lines 140 may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer.

Each of the magnetic patterns 120 may have first sidewalls 120S1 opposite to each other in the first direction D1, and second sidewalls 120S2 opposite to each other in the second direction D2. The second sidewalls 120S2 of each of the magnetic patterns 120 may be aligned (i.e., coplanar) with both (e.g., opposing) sidewalls 110S of a corresponding one of the conductive lines 110, respectively. The first sidewalls 120S1 of each of the magnetic patterns 120 may be aligned with opposing sidewalls 140S of a corresponding one of the tunnel barrier lines 140, respectively, and may be aligned with opposing sidewalls 150S of a corresponding one of the magnetic lines 150, respectively. The sidewalls 140S of the tunnel barrier lines 140 may be aligned with the sidewalls 150S of the magnetic lines 150.

A first interlayer insulating layer 130 may be disposed on the substrate 100 to cover the conductive lines 110 and the magnetic patterns 120. The first interlayer insulating layer 130 may include a first portion 130P1 disposed between the conductive lines 110, and a second portion 130P2 protruding from the first portion 130P1 in the third direction D3 and disposed between the magnetic patterns 120 in the second direction D2. The first portion 130P1 of the first interlayer insulating layer 130 may cover the sidewalls 110S of the conductive lines 110. A top surface of the first portion 130P1 of the first interlayer insulating layer 130 may be substantially coplanar with top surfaces of the conductive lines 110. For example, the top surface of the first portion 130P1 of the first interlayer insulating layer 130 may be located at substantially the same height (relative to the surface 100U of the substrate 100) as the top surfaces of the conductive lines 110. The second portion 130P2 of the first interlayer insulating layer 130 may be disposed between the magnetic patterns 120 arranged in the second direction D2. The second portion 130P2 of the first interlayer insulating layer 130 may cover the second sidewalls 120S2 of the magnetic patterns 120 and may expose the first sidewalls 120S1 of the magnetic patterns 120.

Each of the tunnel barrier lines 140 may be disposed between a corresponding one of the magnetic lines 150 and corresponding ones of the magnetic patterns 120 arranged in the second direction D2 and may extend between each of the magnetic lines 150 and the second portion 130P2 of the first interlayer insulating layer 130. The first sidewalls 120S1 of each of the magnetic patterns 120 and the top surfaces of the conductive lines 110 may not be covered by the first interlayer insulating layer 130 but may be exposed. For example, the first interlayer insulating layer 130 may include at least one of silicon oxide, silicon nitride, or silicon oxynitride.

A second interlayer insulating layer 160 may be disposed on the first interlayer insulating layer 130 and may cover the first sidewalls 120S1 of each of the magnetic patterns 120 and the top surfaces of the conductive lines 110. The second interlayer insulating layer 160 may extend between the tunnel barrier lines 140 and between the magnetic lines 150. The second interlayer insulating layer 160 may cover the sidewalls 140S of the tunnel barrier lines 140 and the sidewalls 150S of the magnetic lines 150. For example, the second interlayer insulating layer 160 may include at least one of silicon oxide, silicon nitride, or silicon oxynitride.

Referring to FIGS. 2E and 2F, each of the magnetic patterns 120 may be a pinned layer having a magnetization direction 120MD fixed in one direction, and each of the magnetic lines 150 may be a free layer having a changeable magnetization direction 150MD. Each of the magnetic domains D may have the magnetization direction 150MD changeable to be parallel (i.e., in the same magnetization direction) or anti-parallel (i.e., in the opposite magnetization direction) to the magnetization direction 120MD of each of the magnetic patterns 120.

Referring to FIG. 2E, in some embodiments, the magnetization direction 120MD of each of the magnetic patterns 120 and the magnetization direction 150MD of each of the magnetic domains D may be perpendicular to an interface between each of the magnetic patterns 120 and the tunnel barrier line 140 corresponding thereto. In this case, the magnetic patterns 120 and the magnetic lines 150 may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where 'n' denotes the number of bilayers.

Referring to FIG. 2F, in certain embodiments, the magnetization direction 120MD of each of the magnetic patterns 120 and the magnetization direction 150MD of each of the magnetic domains D may be parallel to the interface between each of the magnetic patterns 120 and the tunnel barrier line 140 corresponding thereto. In this case, the magnetic patterns 120 and the magnetic lines 150 may include a ferromagnetic material, and the magnetic patterns 120 may further include an anti-ferromagnetic material for fixing a magnetization direction of the ferromagnetic material.

Hereinafter, read and write operations of the magnetic memory device according to some embodiments of the inventive concepts will be described with reference to FIGS. 2A and 2E. The case in which the magnetization directions 120MD and 150MD are perpendicular to the interface between each of the magnetic patterns 120 and the tunnel barrier line 140 corresponding thereto (as shown in FIG. 2E) will be described as an example for ease and convenience in explanation. However, embodiments of the inventive concepts are not limited thereto. The following read and write operations of the magnetic memory device may be applied to the case in which the magnetization directions 120MD and 150MD are parallel to the interface between each of the magnetic patterns 120 and the tunnel barrier line 140 corresponding thereto (as shown in FIG. 2F).

Figure 2A:
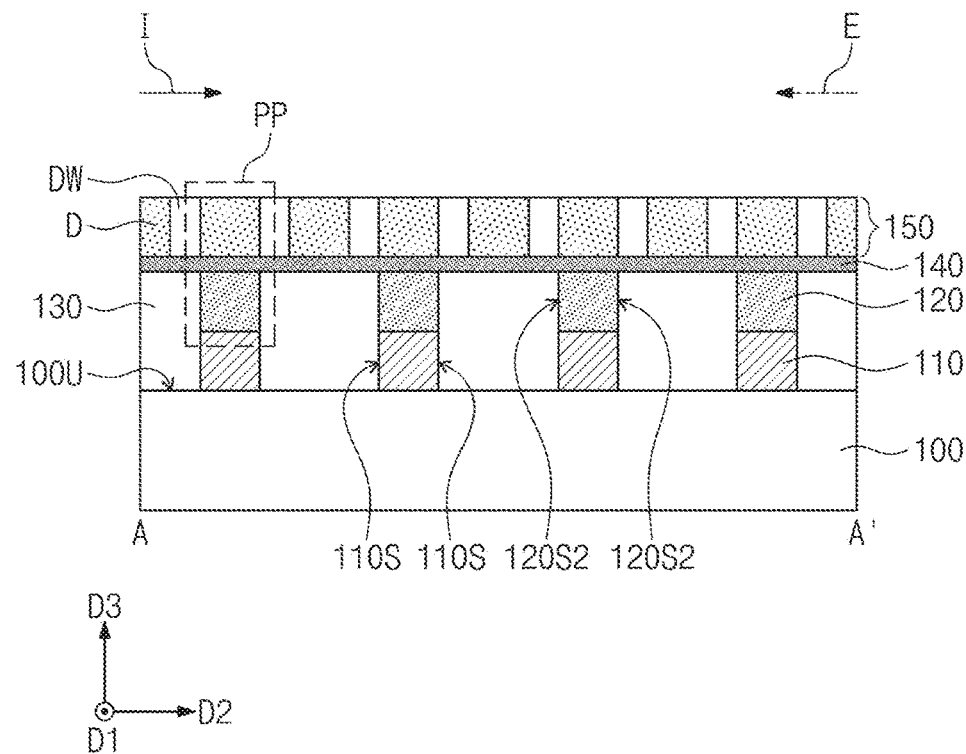
FIGS. 2A, 2B, 2C and 2D are cross-sectional views taken along lines A-A', B-B', C-C' and D-D' of FIG. 1, respectively.
Figure 2B:
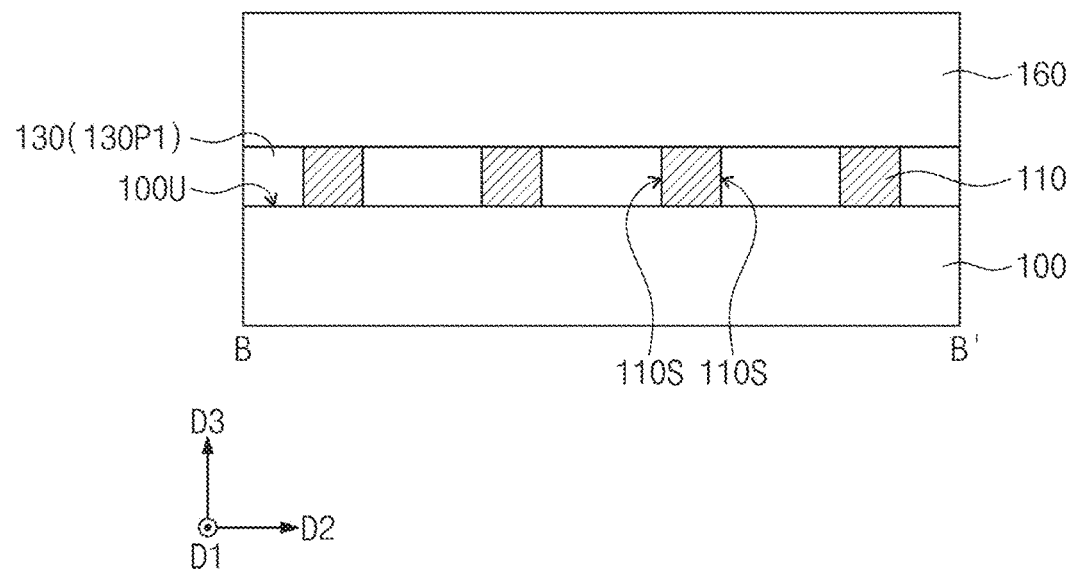
Figure 2C:
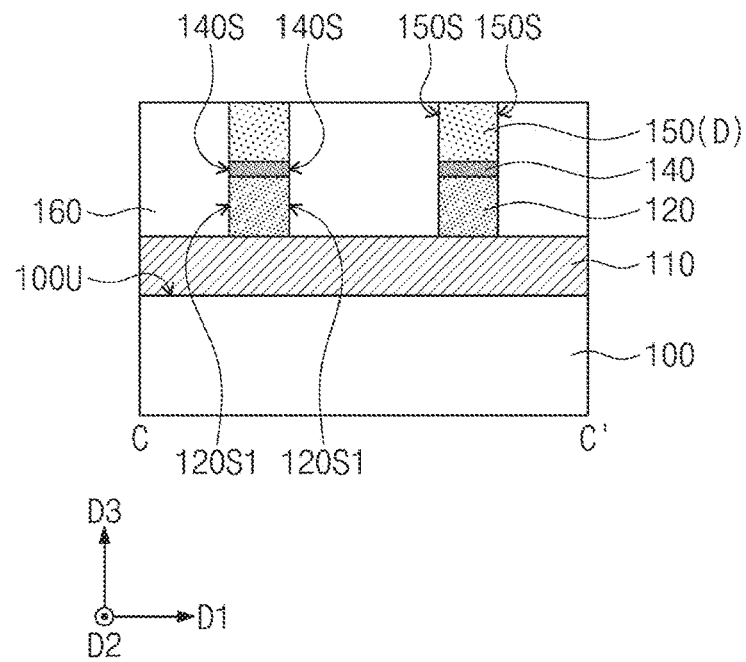
Figure 2D:
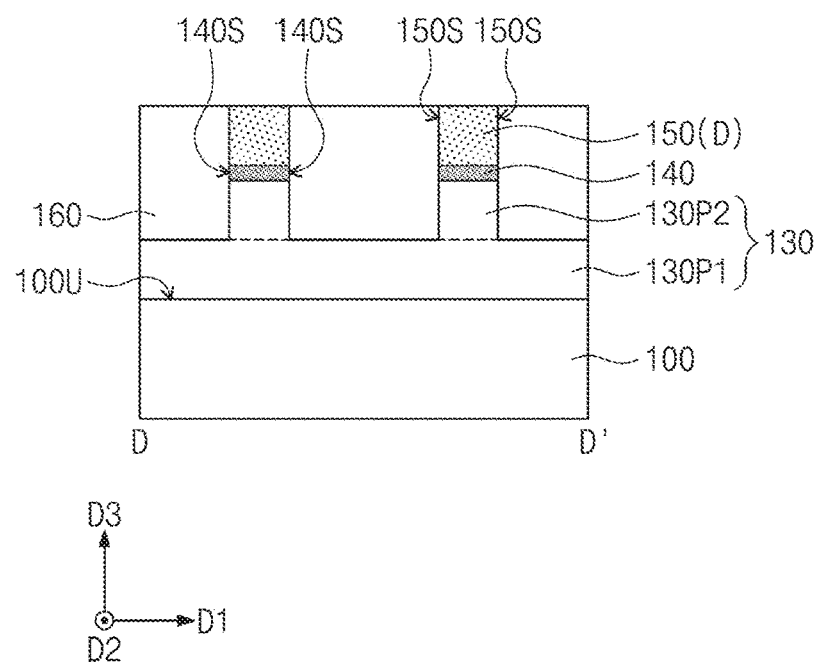
Figure 2E:
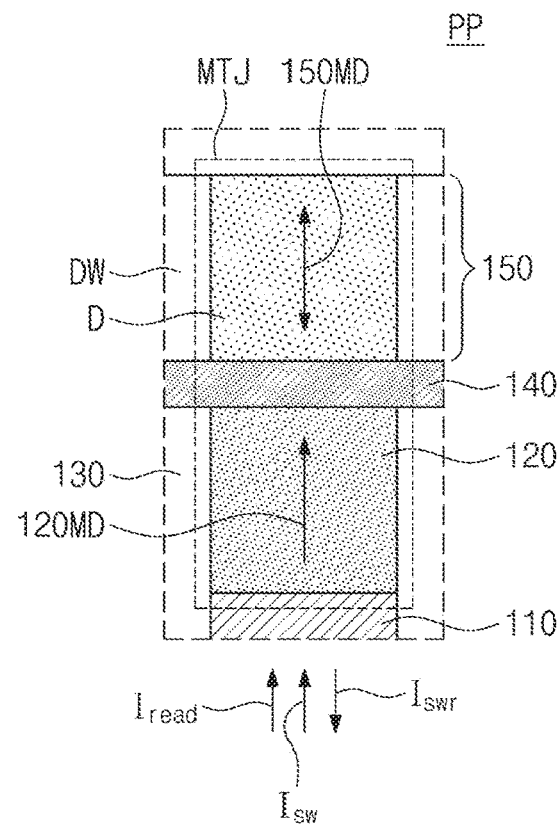
FIGS. 2E and 2F are enlarged views of a portion 'PP' of FIG. 2A.
Figure 2F:
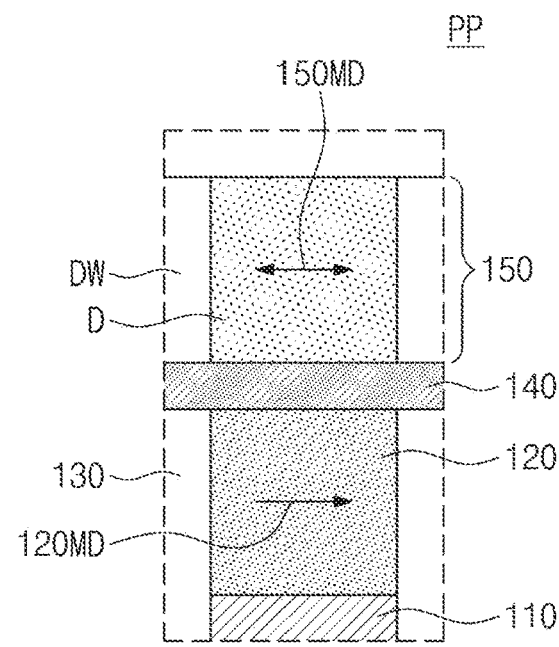
Figure 3:
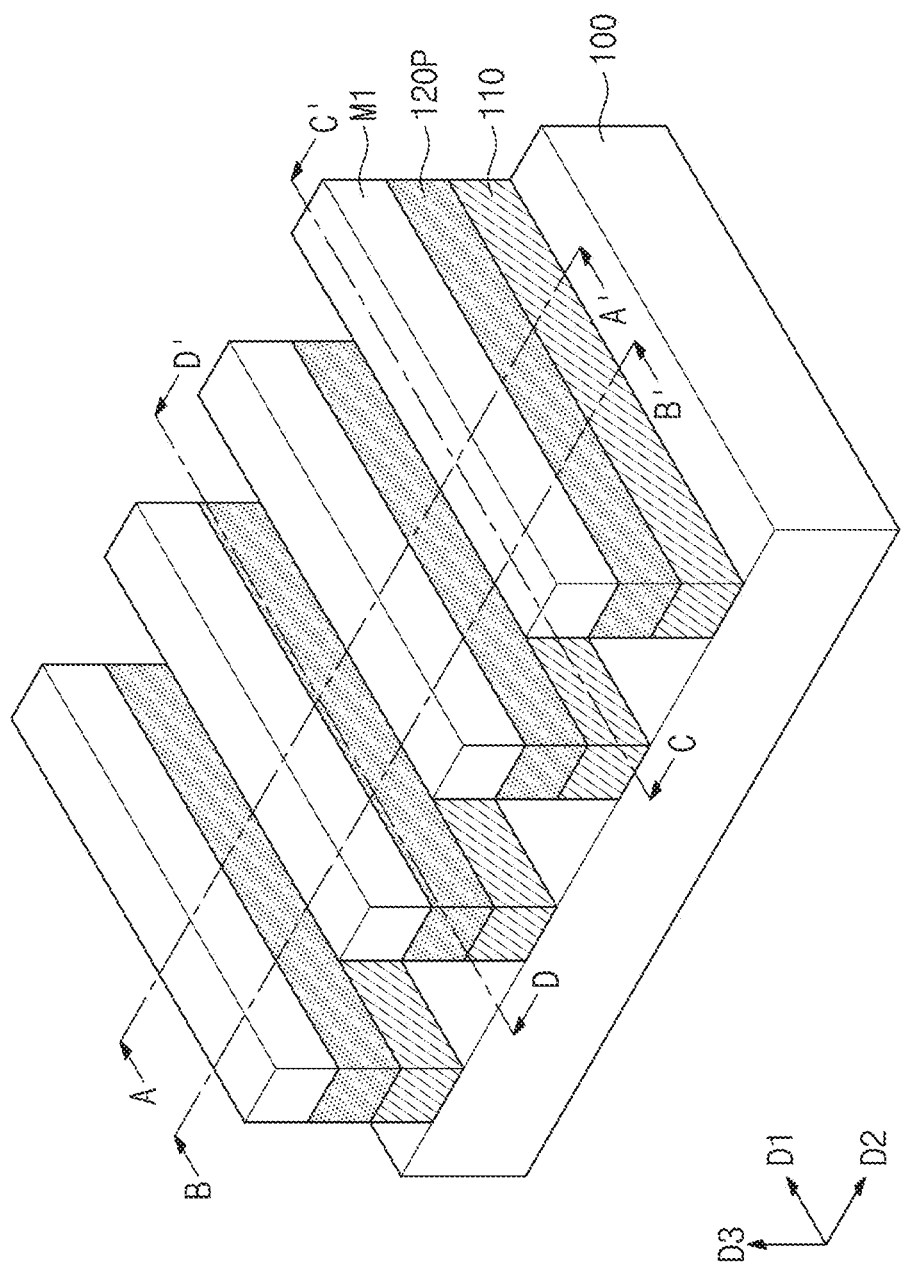
FIGS. 3, 5, 7 and 9 are perspective views illustrating a method for manufacturing a magnetic memory device according to some embodiments of the inventive concepts.
Figure 4A:
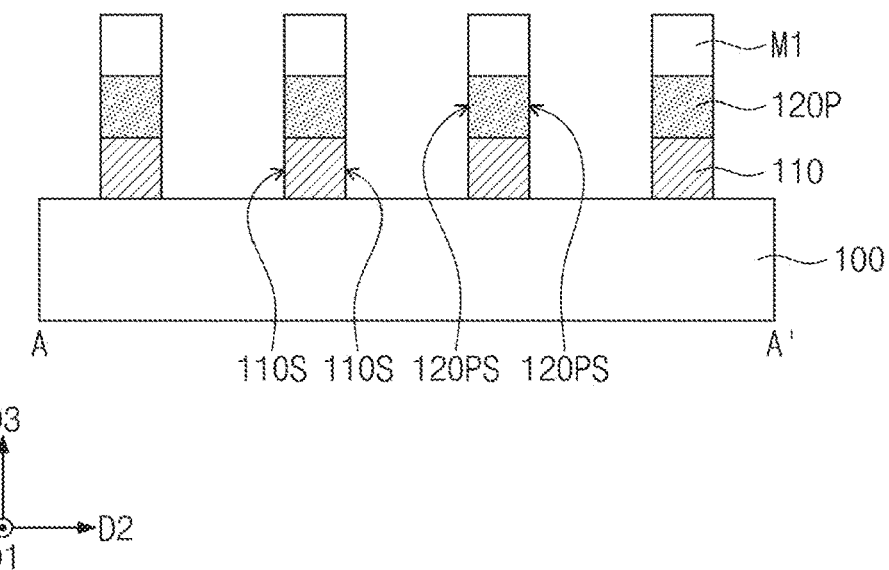
FIGS. 4A, 6A, 8A and 10A are cross-sectional views taken along lines A-A' of FIGS. 3, 5, 7 and 9, respectively.
Figure 4B:
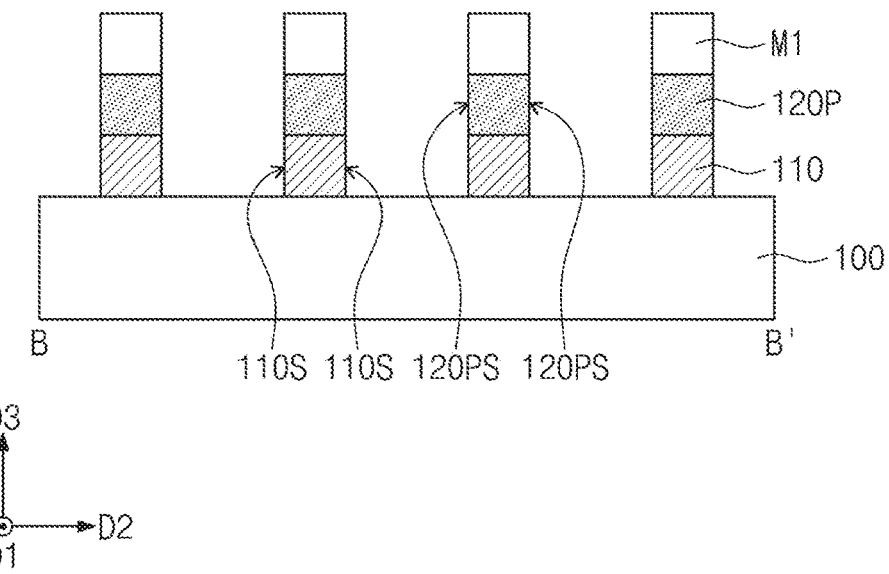
FIGS. 4B, 6B, 8B and 10B are cross-sectional views taken along lines B-B' of FIGS. 3, 5, 7 and 9, respectively.
Figure 4C:
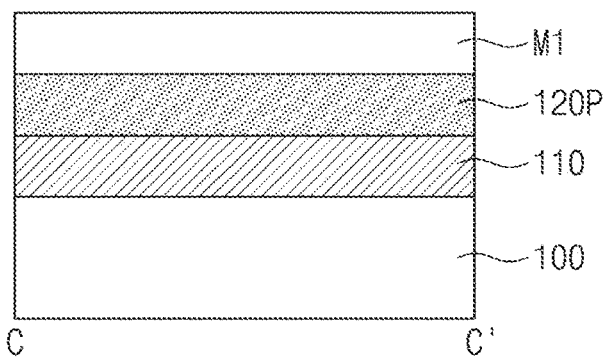
FIGS. 4C, 6C, 8C and 10C are cross-sectional views taken along lines C-C' of FIGS. 3, 5, 7 and 9, respectively.
Figure 4C:
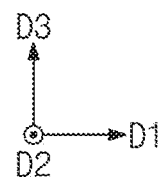
Figure 4D:
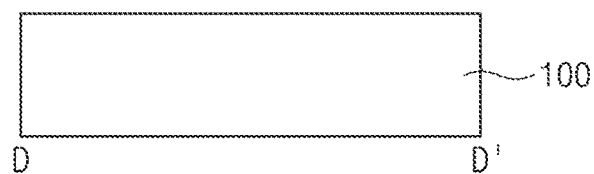
FIGS. 4D, 6D, 8D and 10D are cross-sectional views taken along lines D-D' of FIGS. 3, 5, 7 and 9, respectively.
Figure 4D:
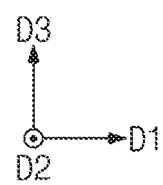
Figure 5:
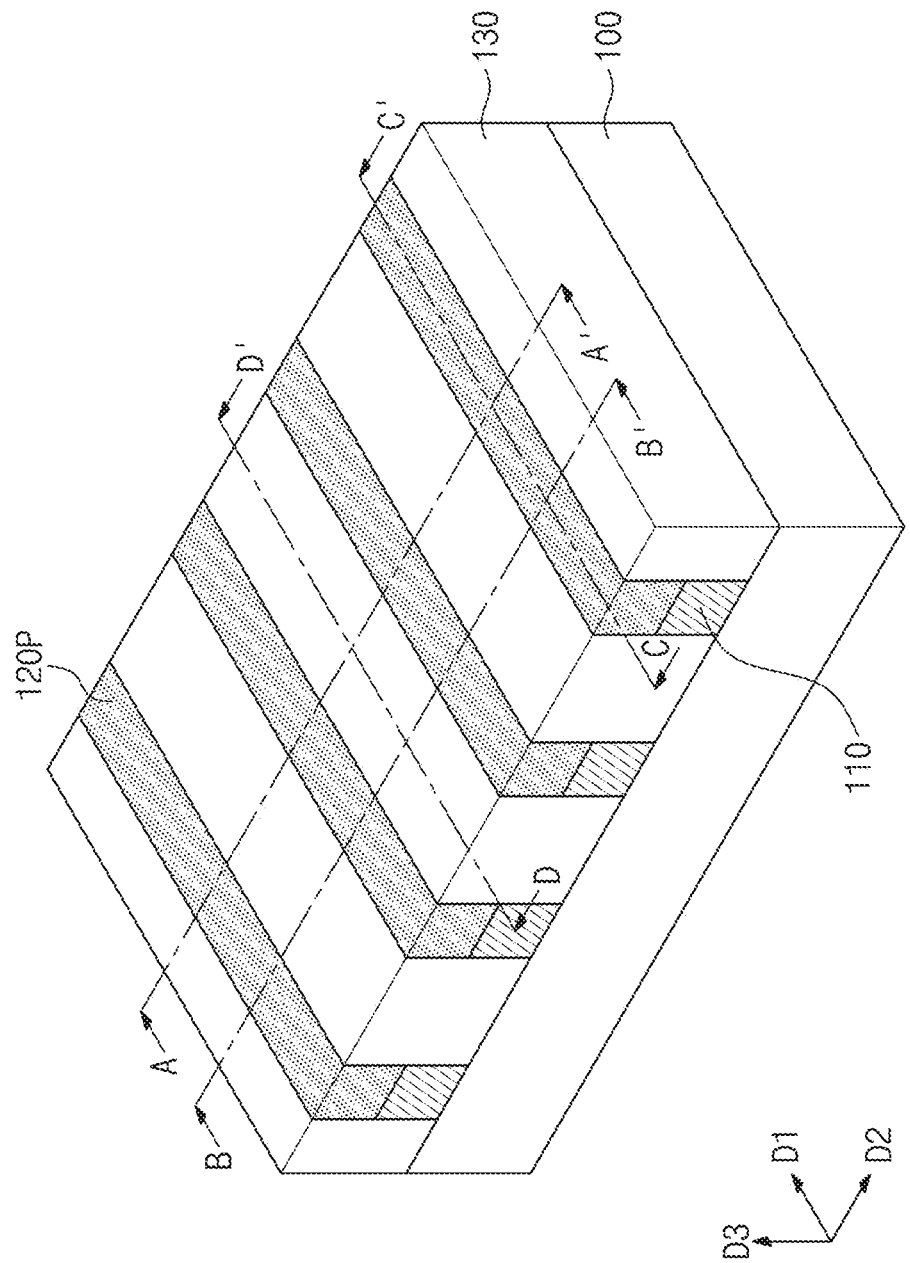
Figure 6A:
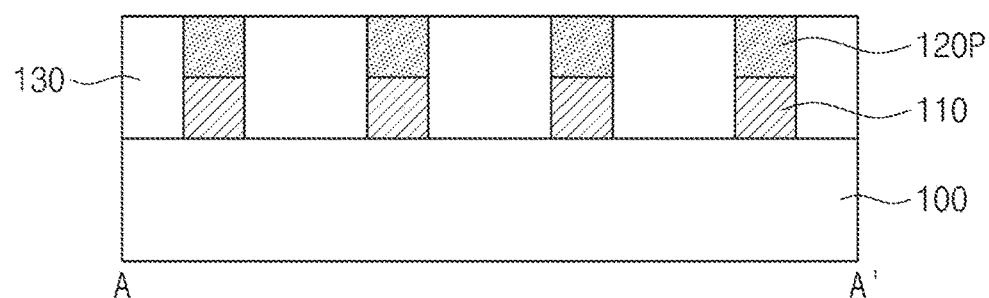
Figure 6A:
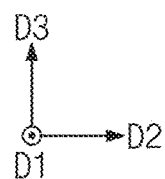
Figure 6B:
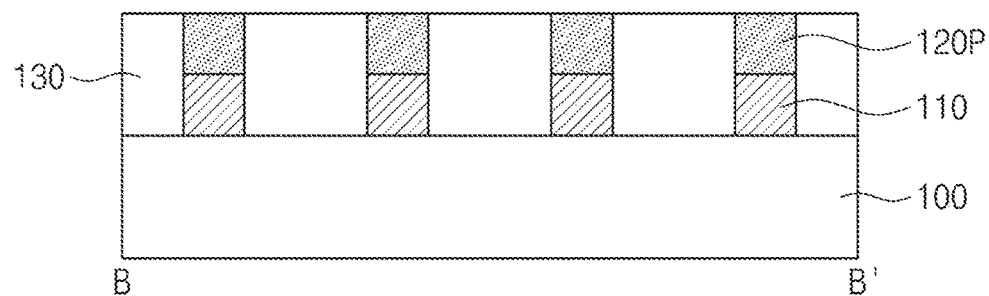
Figure 6B:
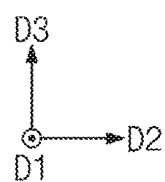
Figure 6C:
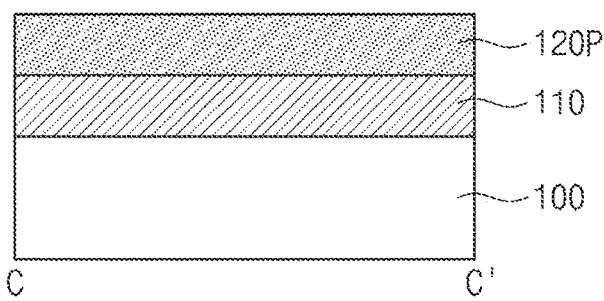
Figure 6C:
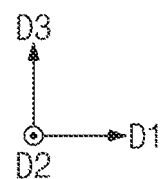
Figure 6D:
Figure 6D:
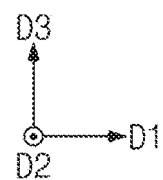
Figure 7:
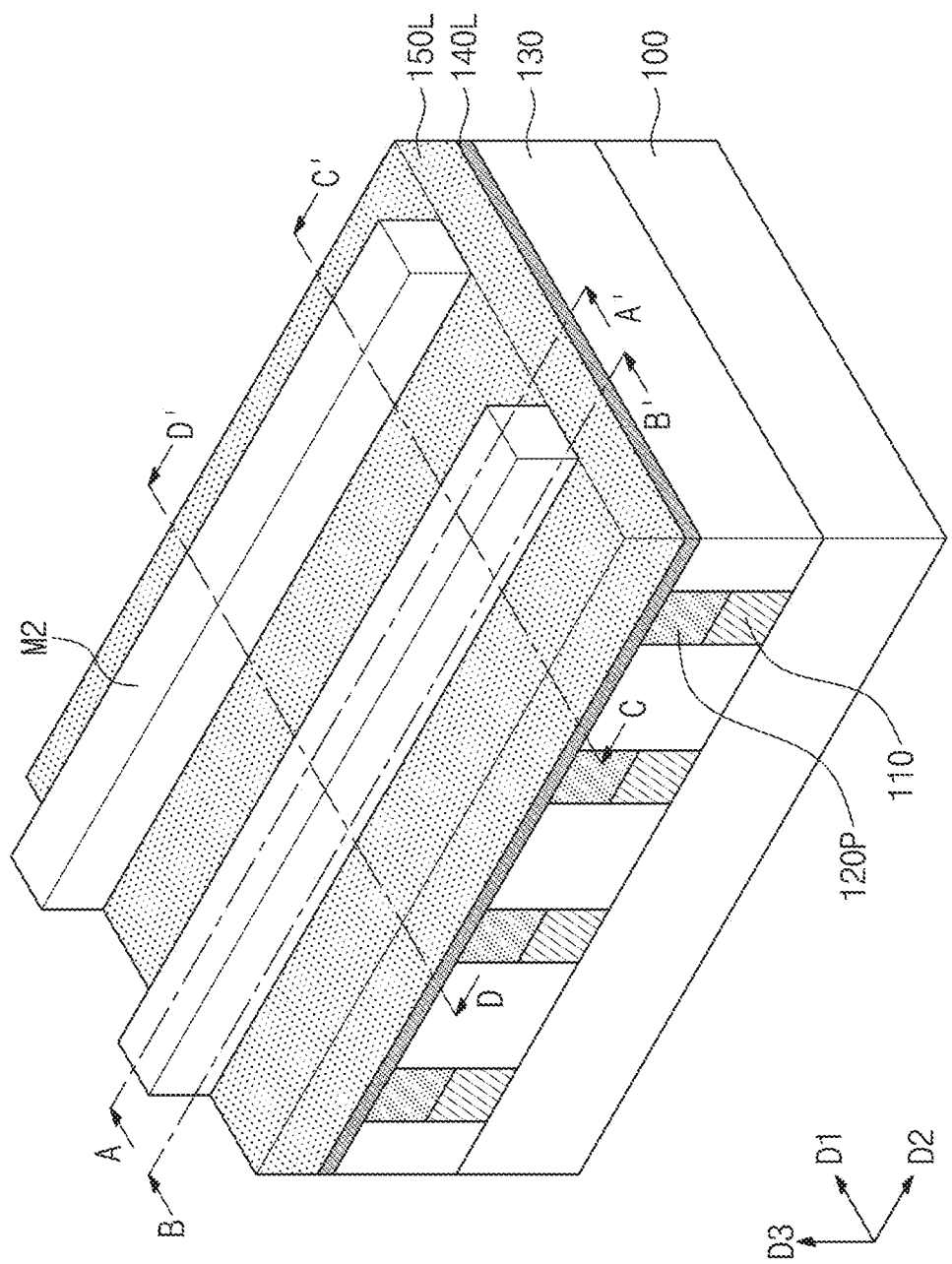
Figure 8A:
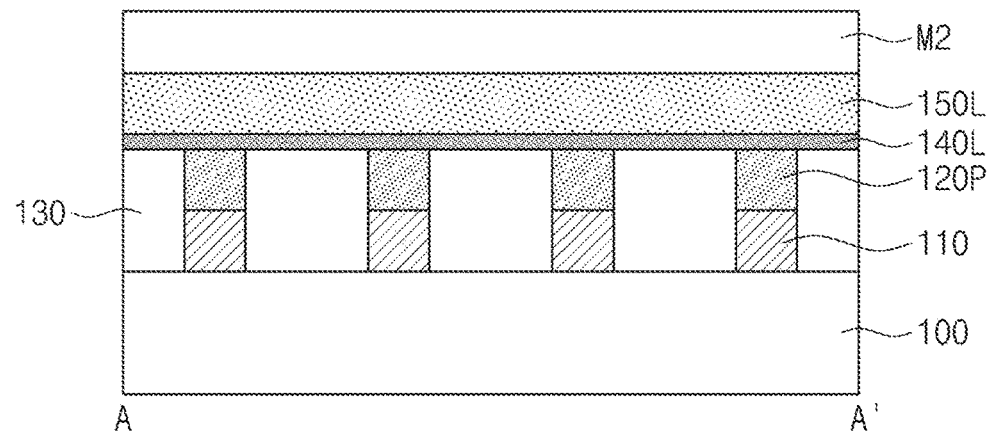
Figure 8A:
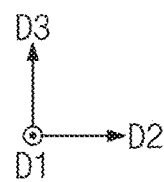
Figure 8B:
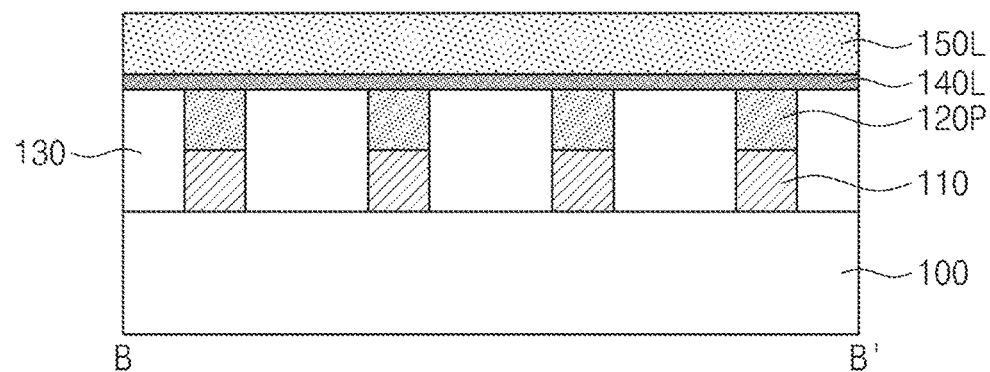
Figure 8B:
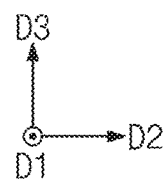
Figure 8C:
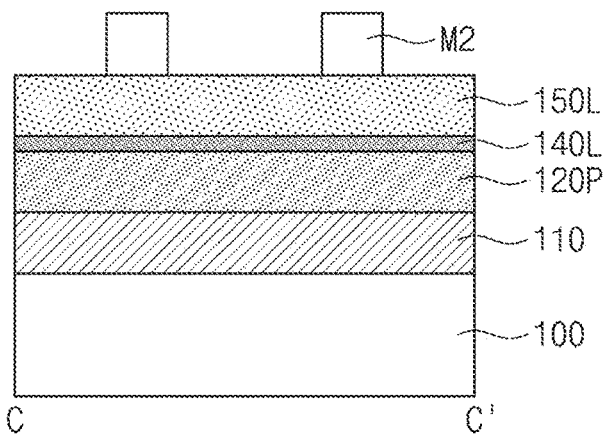
Figure 8C:
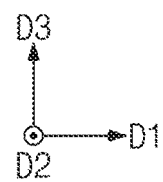
Figure 8D:
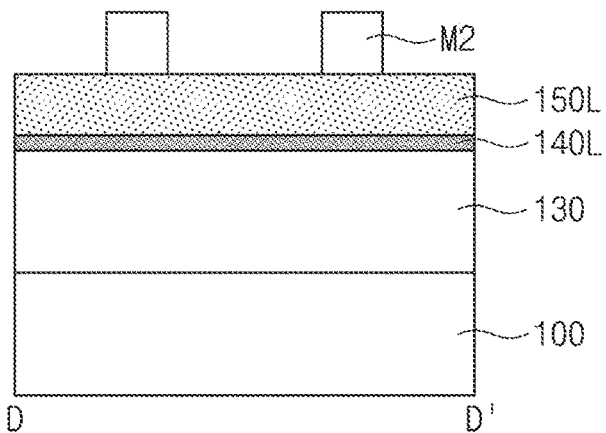
Figure 8D:
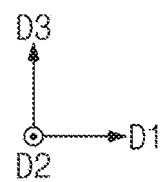
Figure 9:
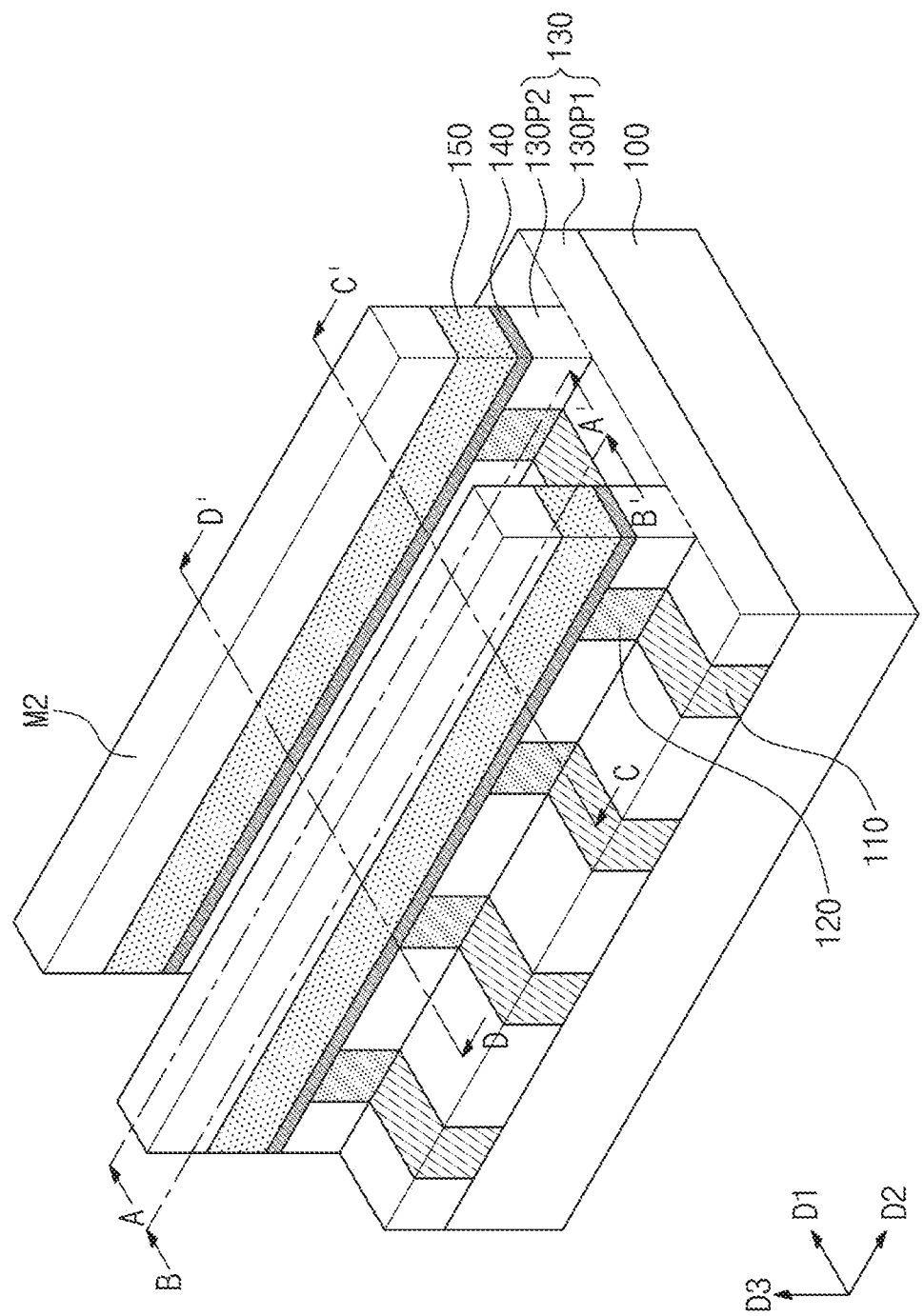
Figure 10A:
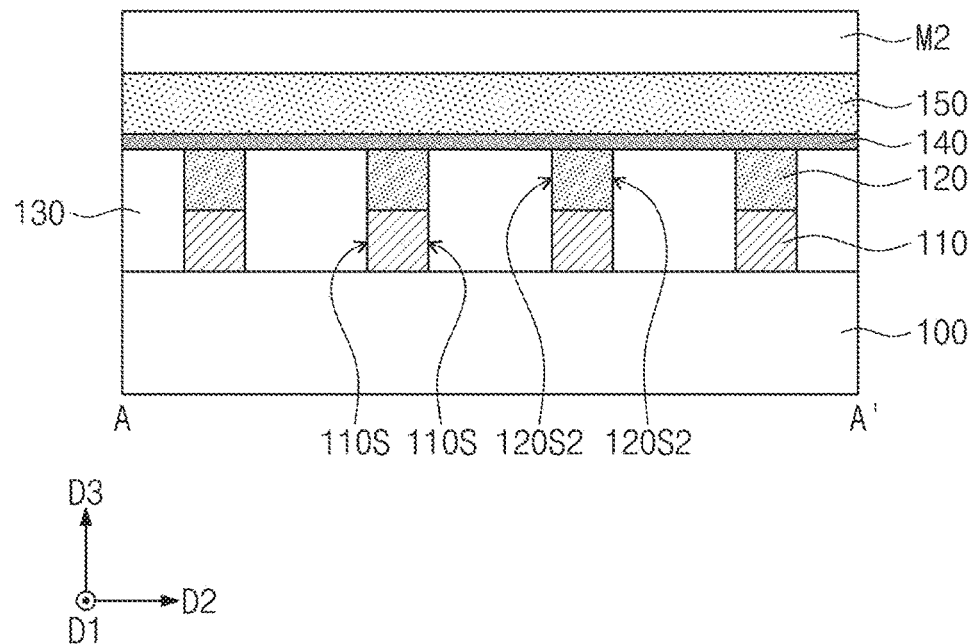
Figure 10B:
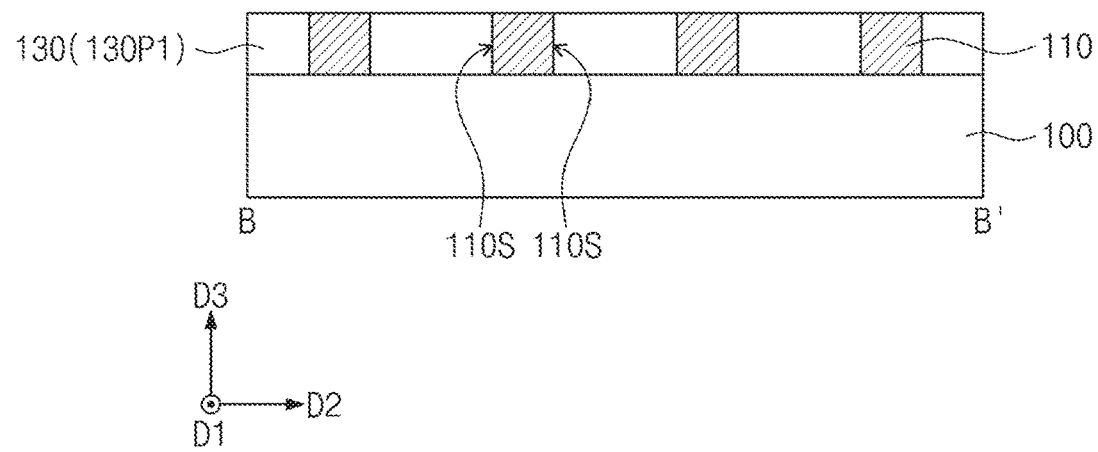
Figure 10C:
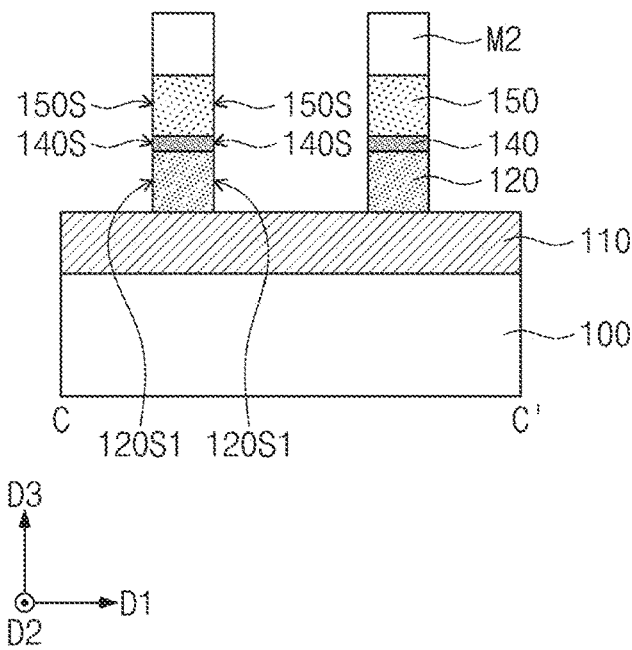
Figure 10D:
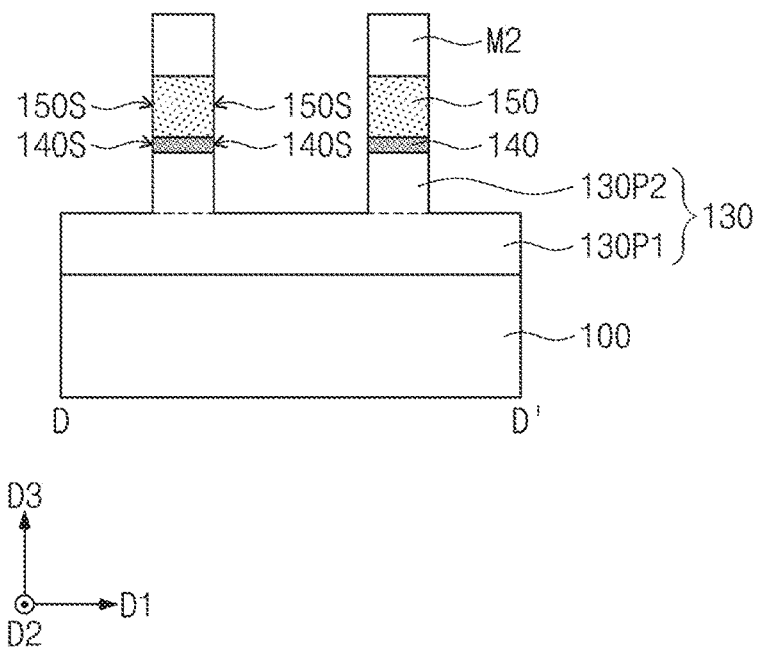

Referring to FIGS. 2A and 2E, a current I for moving the magnetic domain walls DW may flow through one of the magnetic lines 150. A movement direction of the magnetic domain walls DW may be determined by a direction of the current I. The magnetic domain walls DW may be moved in a movement direction of electrons E, and thus the magnetic domain walls DW may be moved in a direction opposite to the direction of the current I. For example, the current I may flow in the second direction D2, and the magnetic domain walls DW may be moved in a direction opposite to the second direction D2. A corresponding one of the magnetic domains D may be aligned on a corresponding one of the magnetic patterns 120 by the movement of the magnetic domain walls DW. The corresponding magnetic domain D and the corresponding magnetic pattern 120 may constitute a magnetic tunnel junction MTJ.

In a read operation, a read current $I_{read}$ may flow through the magnetic tunnel junction MTJ. For example, the read current $I_{read}$ may flow from the corresponding magnetic pattern 120 to the corresponding magnetic domain D along the third direction D3. A resistance state of the magnetic tunnel junction MTJ may be detected by the read current $I_{read}$. Whether the magnetic tunnel junction MTJ is in a high-resistance state or a low-resistance state may be detected by the read current $I_{read}$. For an example, when the magnetization direction 150MD of the corresponding magnetic domain D is parallel to the magnetization direction 120MD of the corresponding magnetic pattern 120, the magnetic tunnel junction MTJ may be in the low-resistance state. For another example, when the magnetization direction 150MD of the corresponding magnetic domain D is anti-parallel to the magnetization direction 120MD of the corresponding magnetic pattern 120, the magnetic tunnel junction MTJ may be in the high-resistance state. Data (0 or 1) stored in the corresponding magnetic domain D may be detected from the resistance state of the magnetic tunnel junction MTJ.

In a write operation, a write current $I_{sw}$ or $I_{swr}$ may flow through the magnetic tunnel junction MTJ. For an example, the write current $I_{sw}$ may flow from the corresponding magnetic pattern 120 to the corresponding magnetic domain D along the third direction D3. For another example, the write current $I_{swr}$ may flow from the corresponding magnetic domain D to the corresponding magnetic pattern 120 along a direction opposite to the third direction D3. A magnitude of the write current $I_{sw}$ or $I_{swr}$ may be greater than a magnitude of the read current $I_{read}$. The magnetization direction 150MD of the corresponding magnetic domain D may be reversed by spin-transfer torque generated by the write current $I_{sw}$ or $I_{swr}$. The magnetization direction 150MD of the corresponding magnetic domain D may be switched in parallel or anti-parallel to the magnetization direction 120MD of the corresponding magnetic pattern 120 by the spin-transfer torque generated by the write current $I_{sw}$ or $I_{swr}$.

Referring again to FIGS. 1 and 2A to 2D, some of the magnetic patterns 120 may function as read elements for performing the read operation, and others of the magnetic patterns 120 may function as write elements for performing the write operation. For example, each of the magnetic lines 150 may be connected in common to the magnetic patterns 120 arranged in the second direction D2. In this case, some of the magnetic patterns 120 arranged in the second direction D2 may function as the read elements, and others of the magnetic patterns 120 arranged in the second direction D2 may function as the write elements.

FIGS. 3, 5, 7 and 9 are perspective views illustrating a method for manufacturing a magnetic memory device according to some embodiments of the inventive concepts. FIGS. 4A, 6A, 8A and 10A are cross-sectional views taken along lines A-A' of FIGS. 3, 5, 7 and 9, respectively, and FIGS. 4B, 6B, 8B and 10B are cross-sectional views taken along lines B-B' of FIGS. 3, 5, 7 and 9, respectively. FIGS. 4C, 6C, 8C and 10C are cross-sectional views taken along lines C-C' of FIGS. 3, 5, 7 and 9, respectively, and FIGS. 4D, 6D, 8D and 10D are cross-sectional views taken along lines D-D' of FIGS. 3, 5, 7 and 9, respectively. Hereinafter, the descriptions to the same features as mentioned with reference to FIGS. 1 and 2A to 2F will be omitted for ease and convenience in explanation.

Referring to FIGS. 3 and 4A to 4D, conductive lines 110 and preliminary magnetic patterns 120P may be formed on a substrate 100. The conductive lines 110 may extend in the first direction D1 and may be spaced apart from each other in the second direction D2. The preliminary magnetic patterns 120P may be formed on the conductive lines 110, respectively. The preliminary magnetic patterns 120P may extend in the first direction D1 and may be spaced apart from each other in the second direction D2. The formation of the conductive lines 110 and the preliminary magnetic patterns 120P may include sequentially forming a conductive layer and a first magnetic layer on the substrate 100, forming first mask patterns M1 on the first magnetic layer, and sequentially etching the first magnetic layer and the conductive layer by using the first mask patterns M1 as etch masks. The conductive layer and the first magnetic layer may be formed using a chemical vapor deposition (CVD) method or a physical vapor deposition (PVD) method (e.g., a sputtering deposition method). The first mask patterns M1 may have linear or line shapes extending in the first direction D1 and may be spaced apart from each other in the second direction D2. The first mask patterns M1 may include a material having an etch selectivity with respect to the first magnetic layer and the conductive layer. For example, the first mask patterns M1 may include silicon oxide, silicon nitride, and/or silicon oxynitride.

The first magnetic layer and the conductive layer may be sequentially etched by a first etching process using the first mask patterns M1 as etch masks, and thus the preliminary magnetic patterns 120P and the conductive lines 110 may be formed. Since the preliminary magnetic patterns 120P are formed using the same mask patterns (i.e., the first mask patterns M1) as the conductive lines 110, sidewalls 120PS of the preliminary magnetic patterns 120P may be aligned with sidewalls 110S of the conductive lines 110.

Referring to FIGS. 5 and 6A to 6D, a first interlayer insulating layer 130 may be formed on the substrate 100 to cover the preliminary magnetic patterns 120P and the conductive lines 110. For example, the formation of the first interlayer insulating layer 130 may include forming a first insulating layer covering the first mask patterns M1, the preliminary magnetic patterns 120P and the conductive lines 110 on the substrate 100, and planarizing the first insulating layer until top surfaces of the preliminary magnetic patterns 120P are exposed. The first mask patterns M1 may be removed during the planarization of the first insulating layer.

Referring to FIGS. 7 and 8A to 8D, a tunnel barrier layer 140L and a second magnetic layer 150L may be sequentially formed on the first interlayer insulating layer 130. The tunnel barrier layer 140L may cover the exposed top surfaces of the preliminary magnetic patterns 120P and a top surface of the first interlayer insulating layer 130. The tunnel barrier layer 140L may be disposed between the second magnetic layer 150L and the preliminary magnetic patterns 120P and between the second magnetic layer 150L and the first interlayer insulating layer 130. The tunnel barrier layer 140L and the second magnetic layer 150L may be formed using a CVD method or a PVD method (e.g., a sputtering deposition method). The second magnetic layer 150L may include a plurality of magnetic domains and a plurality of magnetic domain walls.

Second mask patterns M2 may be formed on the second magnetic layer 150L. The second mask patterns M2 may have linear or line shapes extending in the second direction D2 and may be spaced apart from each other in the first direction D1. The second mask patterns M2 may include a material having an etch selectivity with respect to the tunnel barrier layer 140L and the second magnetic layer 150L. For example, the second mask patterns M2 may include silicon oxide, silicon nitride, and/or silicon oxynitride.

Referring to FIGS. 9 and 10A to 10D, the second magnetic layer 150L, the tunnel barrier layer 140L, the preliminary magnetic patterns 120P and the first interlayer insulating layer 130 may be etched by a second etching process using the second mask patterns M2 as etch masks. The second magnetic layer 150L and the tunnel barrier layer 140L may be sequentially etched by the second etching process, and thus magnetic lines 150 and tunnel barrier lines 140 may be formed. The magnetic lines 150 may extend in the second direction D2 to intersect the preliminary magnetic patterns 120P and may be spaced apart from each other in the first direction D1. The tunnel barrier lines 140 may extend in the second direction D2 between the magnetic lines 150 and the preliminary magnetic patterns 120P to intersect the preliminary magnetic patterns 120P and may be spaced apart from each other in the first direction D1. Since the tunnel barrier lines 140 are formed using the same mask patterns (i.e., the second mask patterns M2) as the magnetic lines 150, sidewalls 140S of the tunnel barrier lines 140 may be aligned with sidewalls 150S of the magnetic lines 150.

Portions of the preliminary magnetic patterns 120P, which are disposed at both (e.g., opposing) sides of each of the magnetic lines 150, may be etched by the second etching process. The second etching process may be performed until the top surfaces of the conductive lines 110 at opposing sides of each of the magnetic lines 150 are exposed. The conductive lines 110 may function as an etch stop layer in the second etching process. Since the preliminary magnetic patterns 120P are patterned by the second etching process, magnetic patterns 120 may be formed under each of the magnetic lines 150. The magnetic patterns 120 may be spaced apart from each other in the second direction D2 under each of the magnetic lines 150. Spatially relative terms, such as "beneath," "below," "lower," "under," "above," "upper," and the like, may be used herein for ease of description to describe one element's relationship to another element(s) as illustrated in the figures, but will be understood to encompass different orientations in addition to the orientation depicted in the figures. Each of the tunnel barrier lines 140 may be disposed between a corresponding one of the magnetic lines 150 and corresponding ones of the magnetic patterns 120. The magnetic patterns 120 may be locally formed at intersection points or respective intersections of each of the magnetic lines 150 and the conductive lines 110.

Each of the magnetic patterns 120 may have first sidewalls 120S1 opposite to each other in the first direction D1, and second sidewalls 120S2 opposite to each other in the second direction D2. Since the preliminary magnetic patterns 120P are formed using the same mask patterns (i.e., the first mask patterns M1) as the conductive lines 110, the second sidewalls 120S2 of each of the magnetic patterns 120 may be aligned with opposing sidewalls 110S of a corresponding one of the conductive lines 110, respectively. In addition, since the magnetic patterns 120 are formed using the same mask patterns (i.e., the second mask patterns M2) as the magnetic lines 150 and the tunnel barrier lines 140, the first sidewalls 120S1 of each of the magnetic patterns 120 may be aligned with opposing sidewalls 140S of a corresponding one of the tunnel barrier lines 140, respectively, and may be aligned with opposing sidewalls 150S of a corresponding one of the magnetic lines 150, respectively.

Portions of the first interlayer insulating layer 130, which are disposed at opposing sides of each of the magnetic lines 150, may be etched by the second etching process. Since the first interlayer insulating layer 130 is patterned by the second etching process, the first interlayer insulating layer 130 may include a first portion 130P1 disposed between the conductive lines 110, and a second portion 130P2 disposed between the magnetic patterns 120. The first portion 130P1 of the first interlayer insulating layer 130 may cover the sidewalls 110S of the conductive lines 110 and may expose the top surfaces of the conductive lines 110. The second portion 130P2 of the first interlayer insulating layer 130 may cover the second sidewalls 120S2 of the magnetic patterns 120 and may expose the first sidewalls 120S1 of the magnetic patterns 120.

Referring again to FIGS. 1 and 2A to 2D, a second interlayer insulating layer 160 may be formed on the first interlayer insulating layer 130 and may cover the first sidewalls 120S1 of each of the magnetic patterns 120 and the top surfaces of the conductive lines 110. The second interlayer insulating layer 160 may be formed to cover the sidewalls 140S of the tunnel barrier lines 140 and the sidewalls 150S of the magnetic lines 150. For example, the formation of the second interlayer insulating layer 160 may include forming a second insulating layer covering the conductive lines 110, the magnetic patterns 120, the tunnel barrier lines 140, the magnetic lines 150 and the second mask patterns M2 on the first interlayer insulating layer 130, and planarizing the second insulating layer until top surfaces of the magnetic lines 150 are exposed. The second mask patterns M2 may be removed during the planarization of the second insulating layer.

According to embodiments of the inventive concepts, the preliminary magnetic patterns 120P may be formed using the first mask patterns M1 as etch masks, and the preliminary magnetic patterns 120P may be patterned using the second mask patterns M2 as etch masks, thereby forming the magnetic patterns 120. Thus, the magnetic patterns 120 may be self-aligned with the intersection points or respective intersections of the magnetic lines 150 and the conductive lines 110.

In addition, the preliminary magnetic patterns 120P may be formed using the same mask patterns (i.e., the first mask patterns M1) as the conductive lines 110, and the magnetic patterns 120 may be formed using the same mask patterns (i.e., the second mask patterns M2) as the magnetic lines 150 and the tunnel barrier lines 140. In other words, an additional mask pattern for forming the magnetic patterns 120 may not be required.

As a result, processes for manufacturing a magnetic memory device may be simplified, and thus the high integration density and mass production of the magnetic memory device may be more easily realized.

Figure 11:
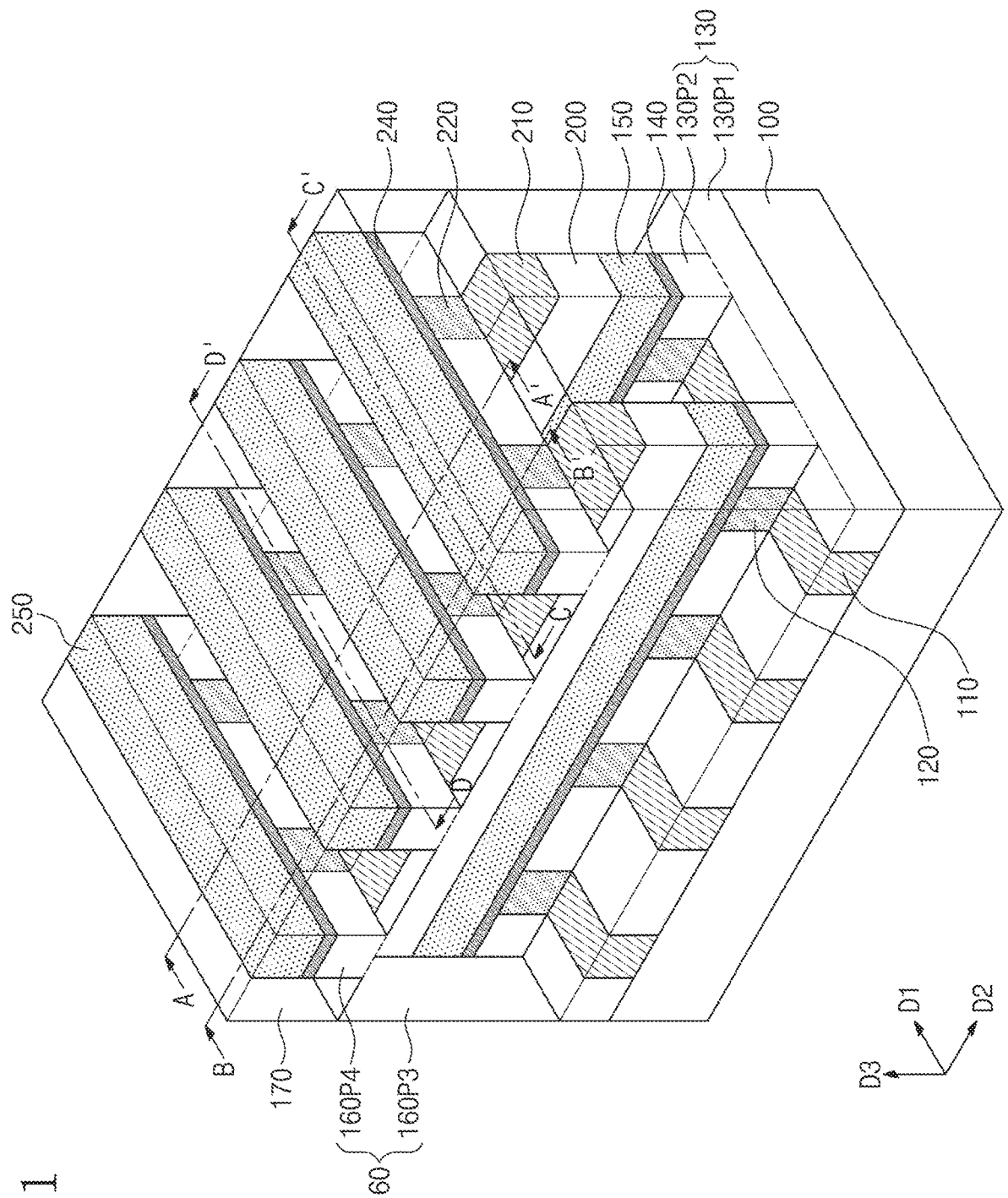
FIG. 11 is a perspective view schematically illustrating a magnetic memory device according to some embodiments of the inventive concepts.
Figure 12A:
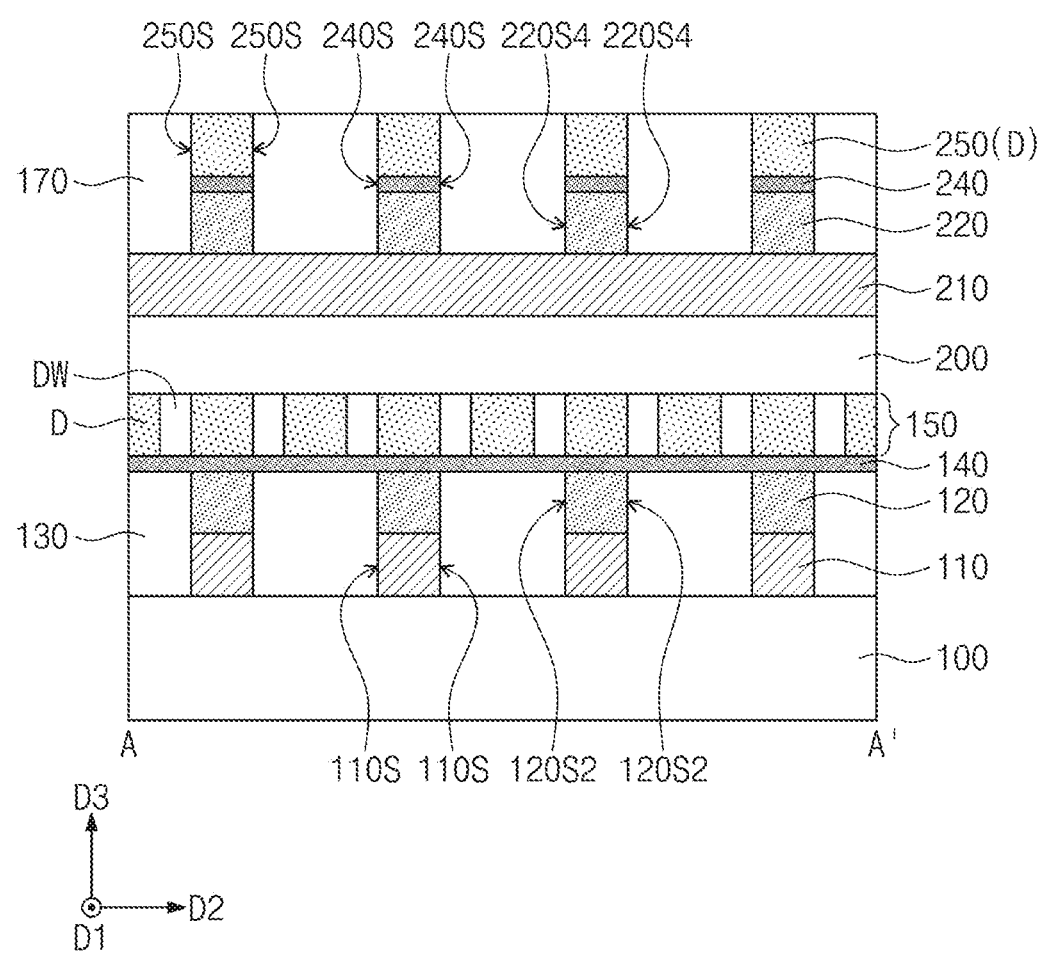
FIGS. 12A, 12B, 12C and 12D are cross-sectional views taken along lines A-A', B-B', C-C' and D-D' of FIG. 11, respectively.
Figure 12B:
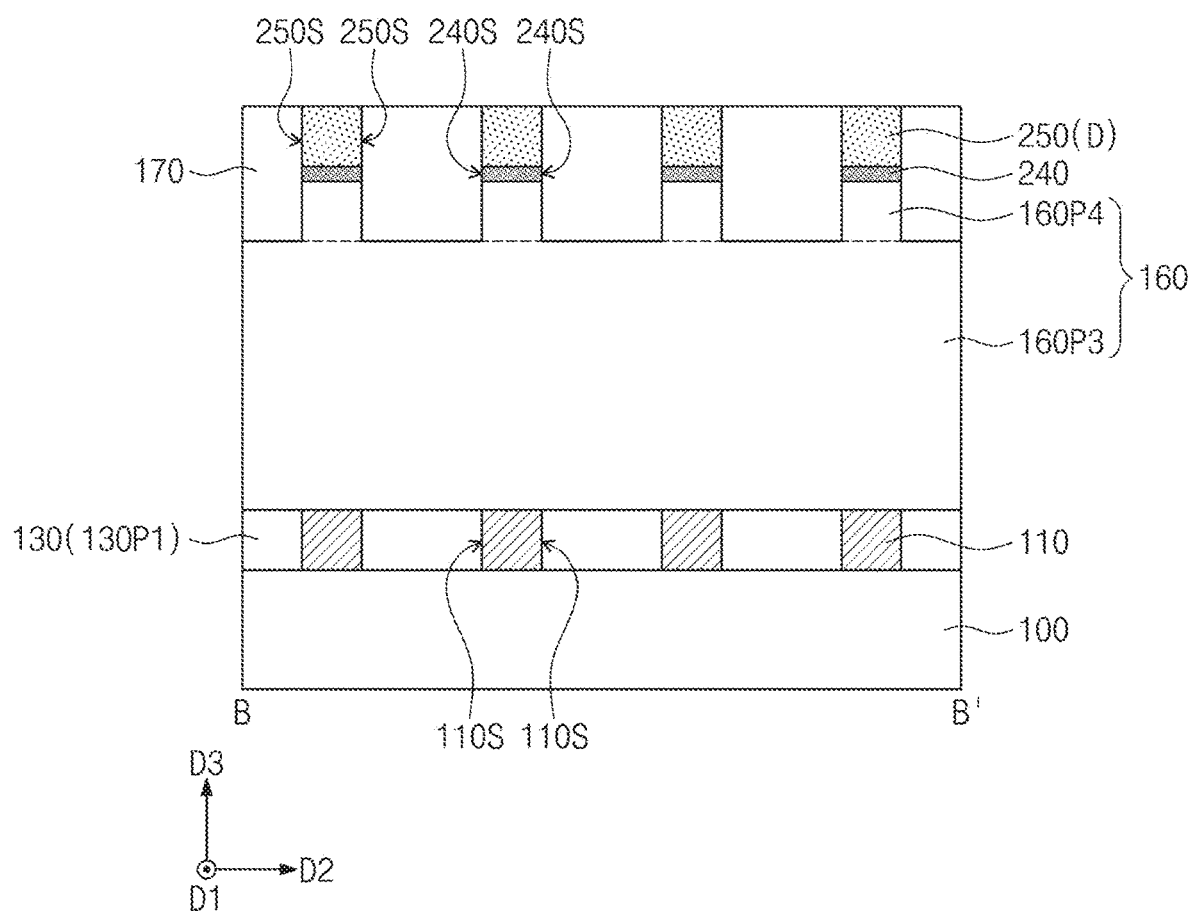
Figure 12C:
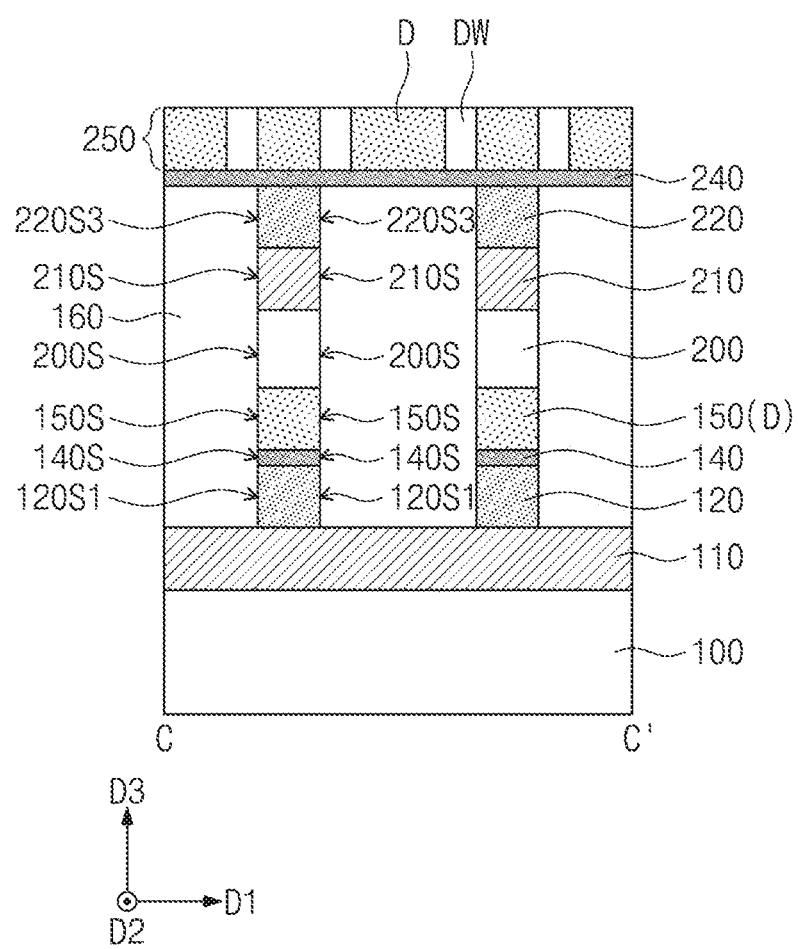
Figure 12D:
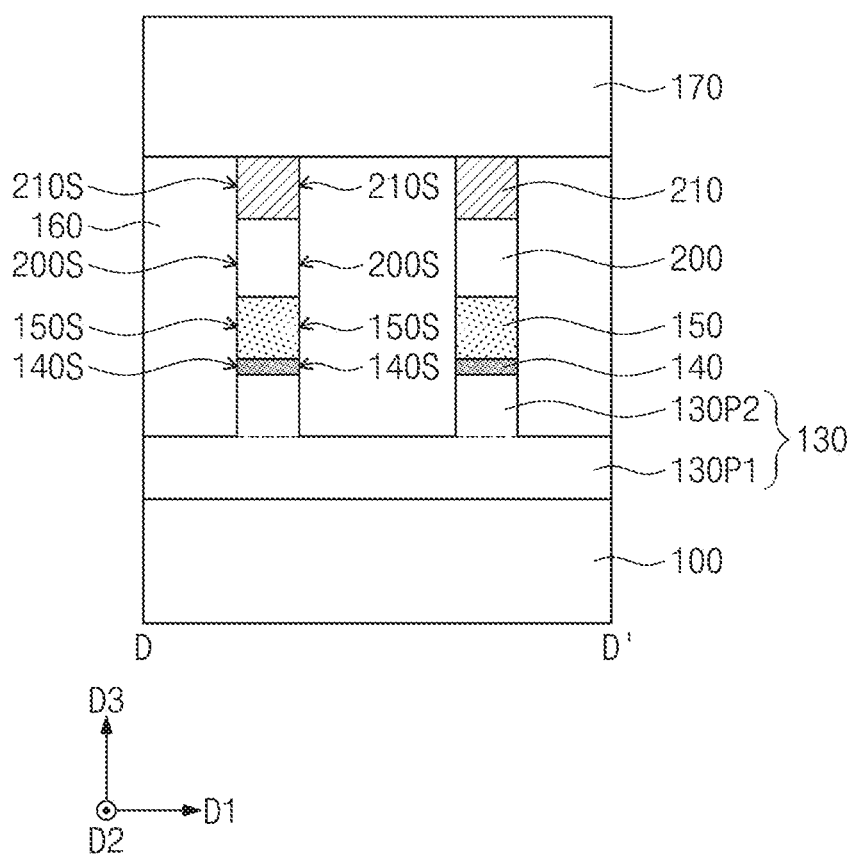
Figure 13:
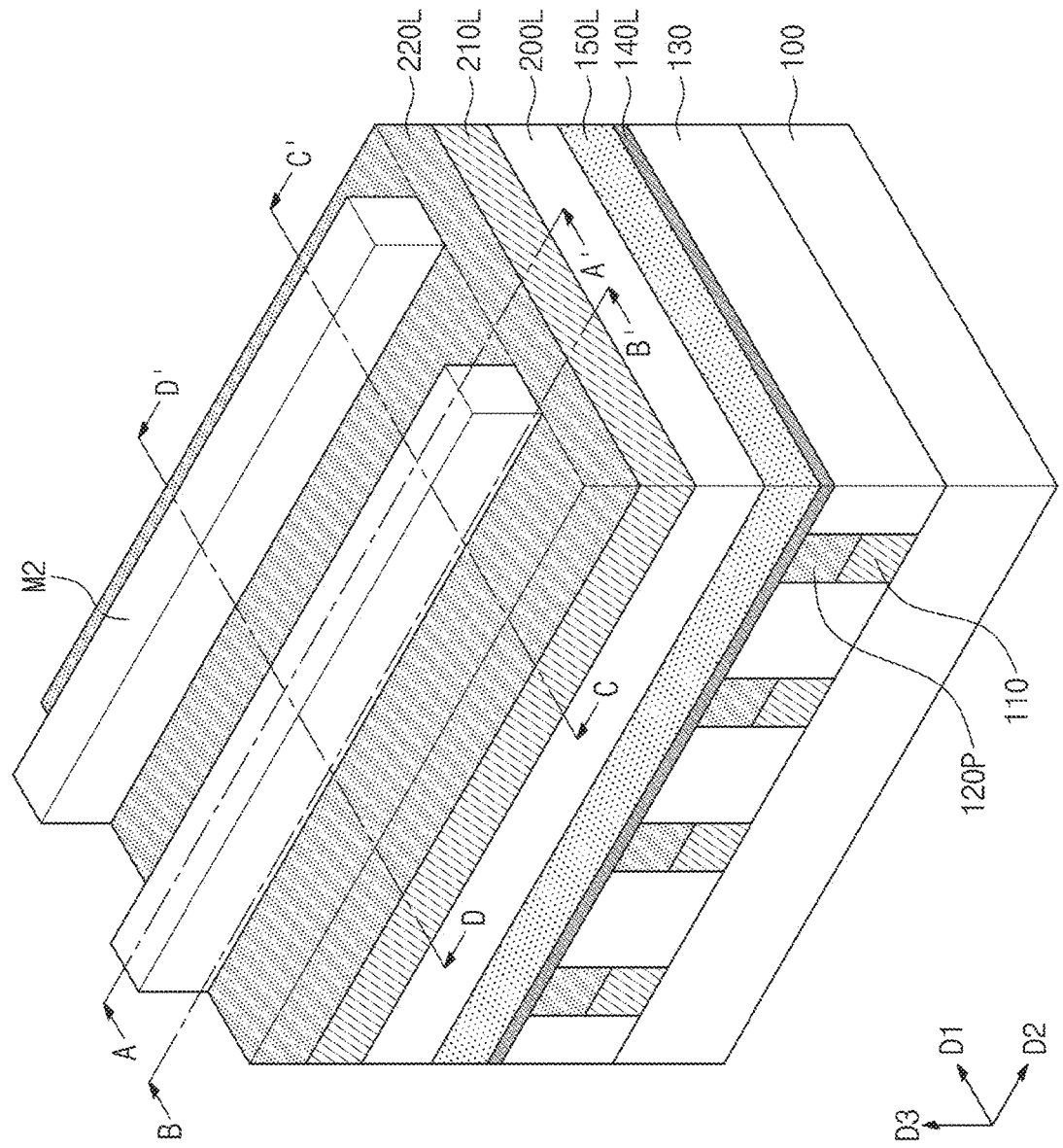
FIGS. 13, 15, 17 and 19 are perspective views illustrating a method for manufacturing a magnetic memory device according to some embodiments of the inventive concepts.
Figure 14A:
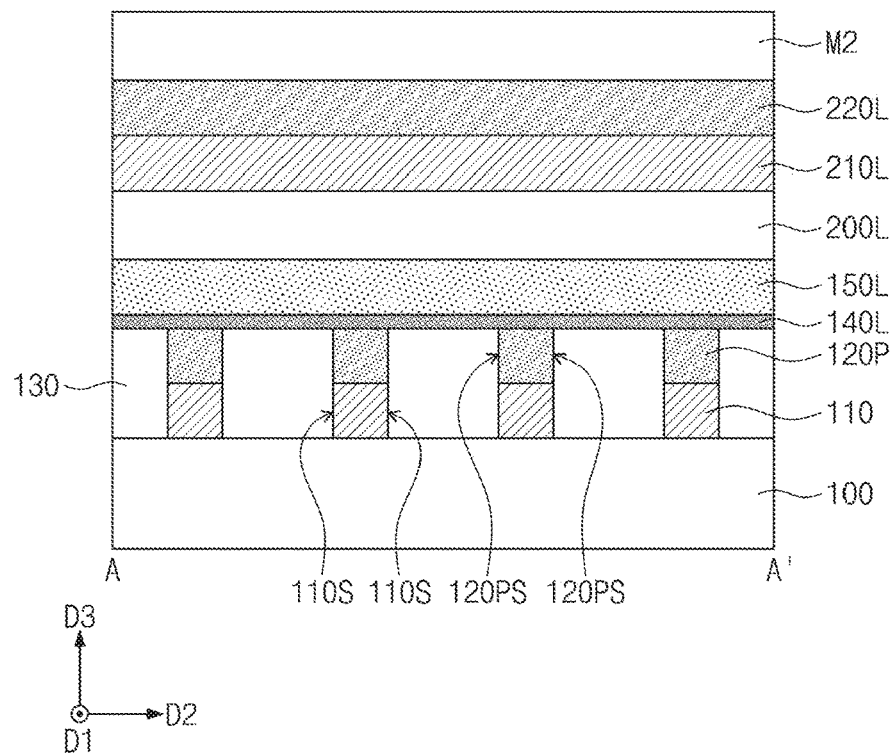
FIGS. 14A, 16A, 18A and 20A are cross-sectional views taken along lines A-A' of FIGS. 13, 15, 17 and 19, respectively.
Figure 14B:
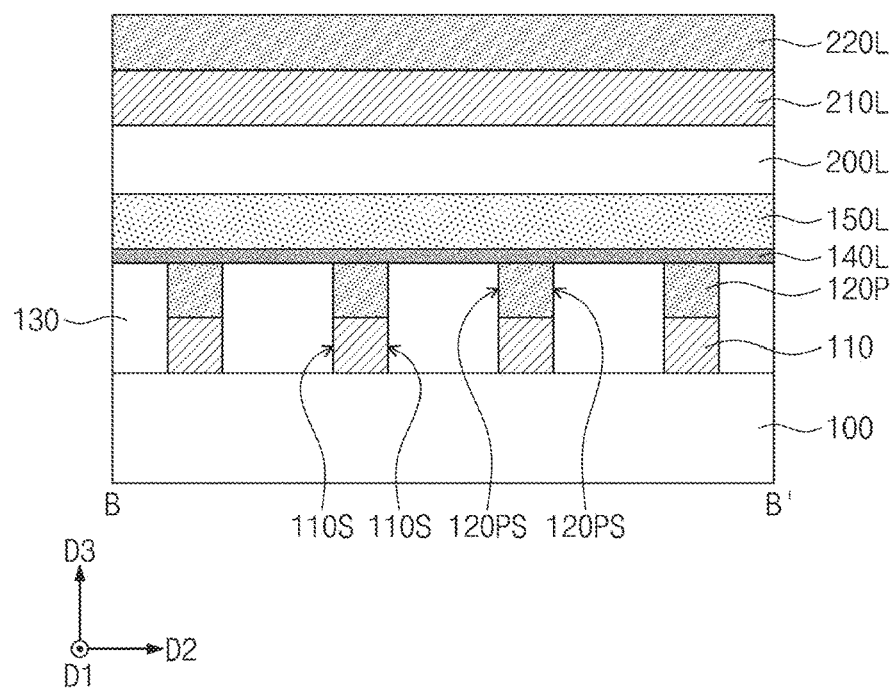
FIGS. 14B, 16B, 18B and 20B are cross-sectional views taken along lines B-B' of FIGS. 13, 15, 17 and 19, respectively.
Figure 14C:
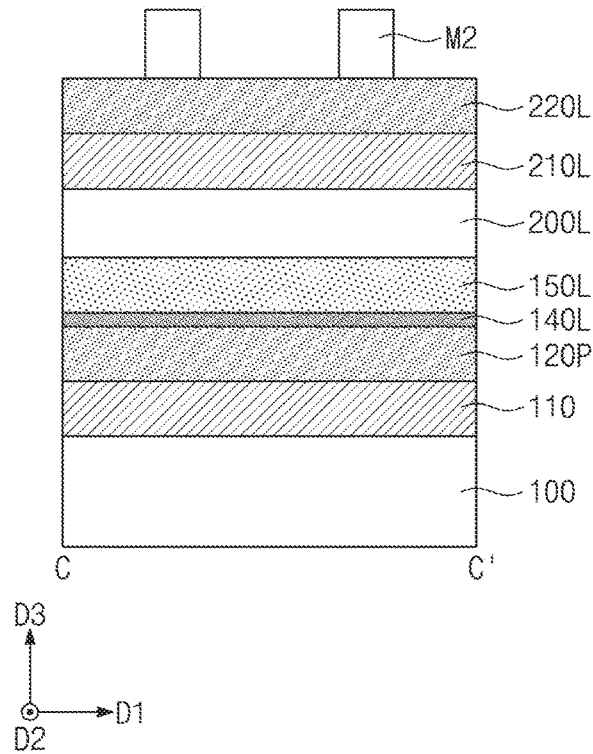
FIGS. 14C, 16C, 18C and 20C are cross-sectional views taken along lines C-C' of FIGS. 13, 15, 17 and 19, respectively.
Figure 14D:
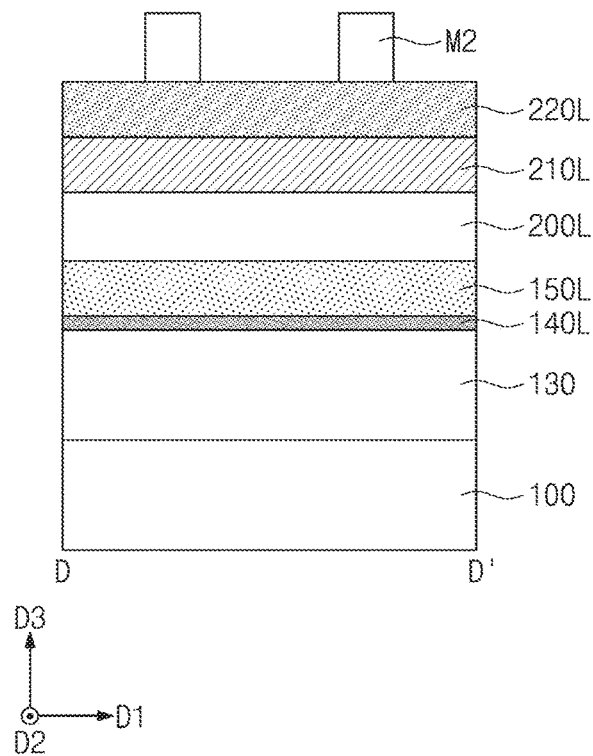
FIGS. 14D, 16D, 18D and 20D are cross-sectional views taken along lines D-D' of FIGS. 13, 15, 17 and 19, respectively.
Figure 15:
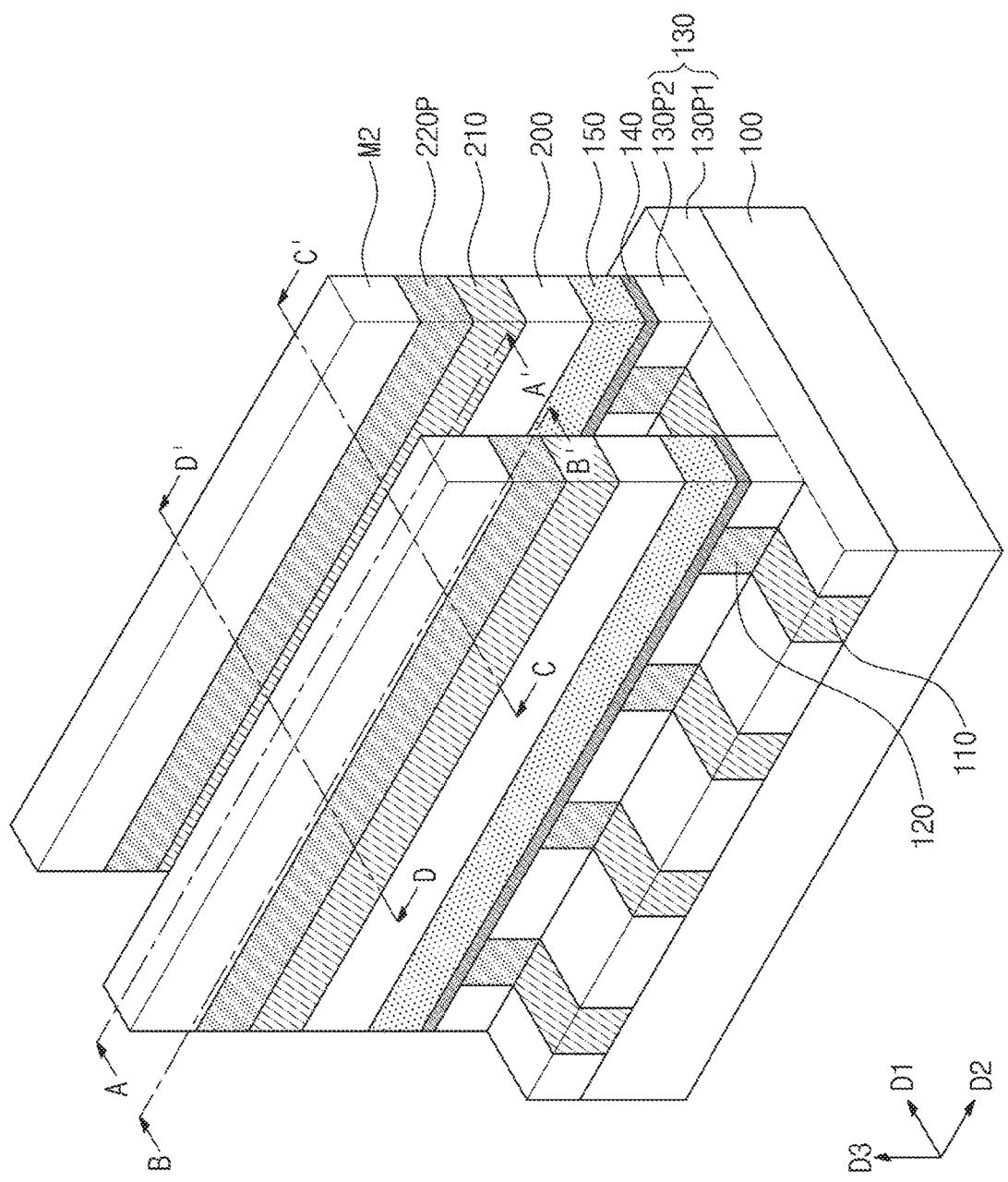
Figure 16A:
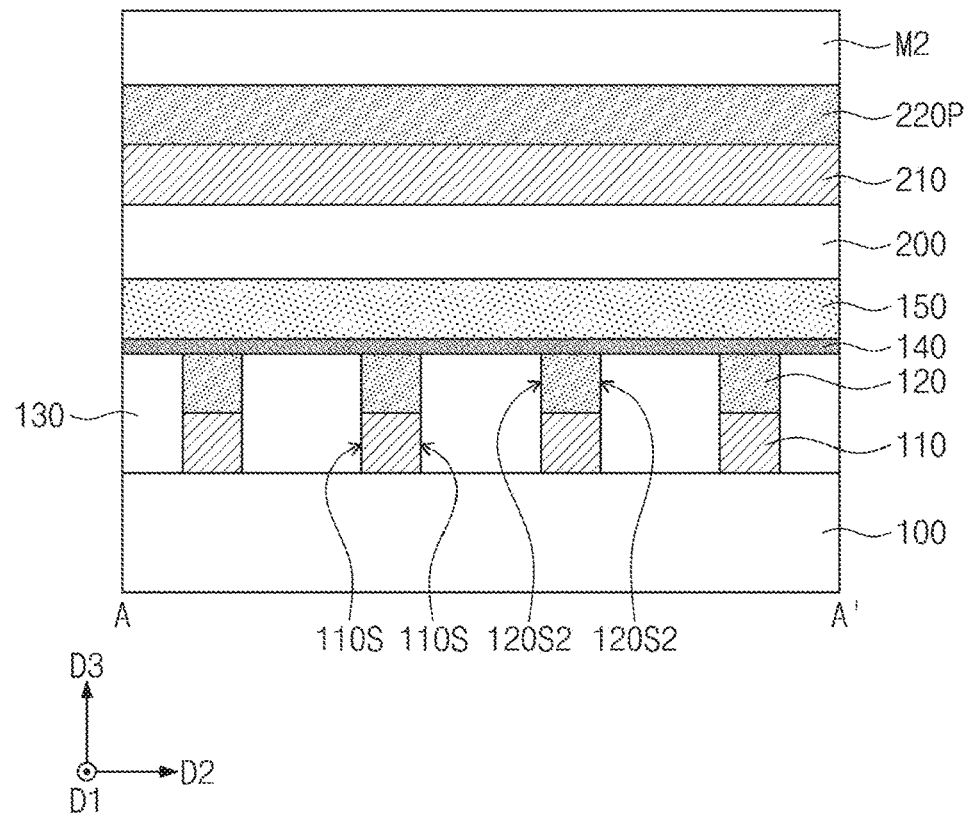
Figure 16B:
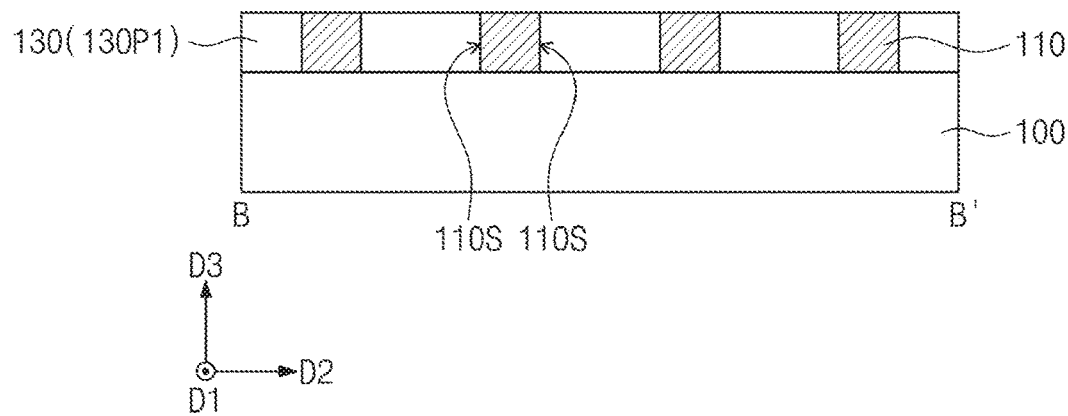
Figure 16C:
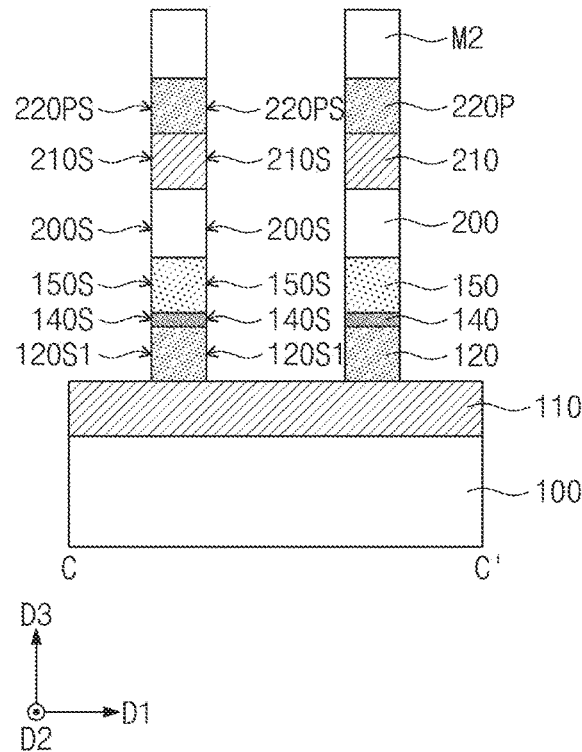
Figure 16D:
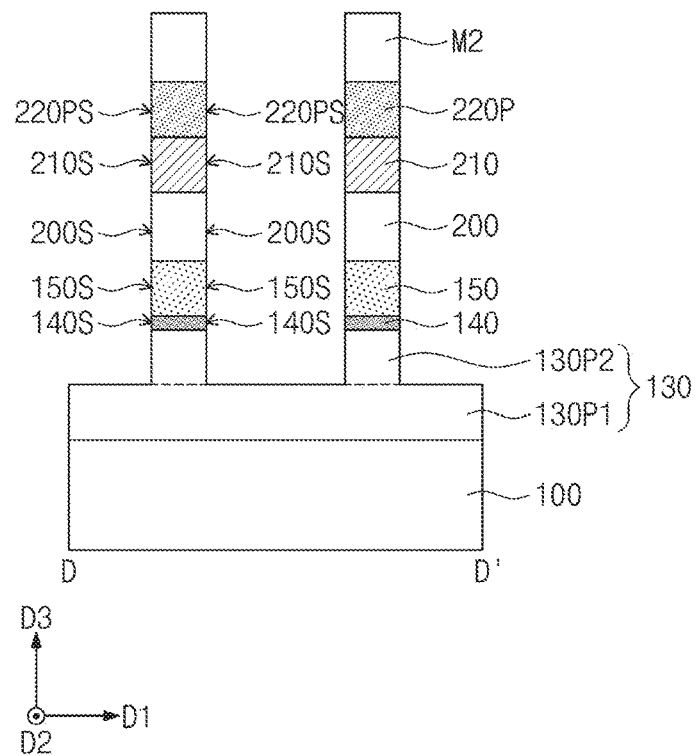
Figure 17:
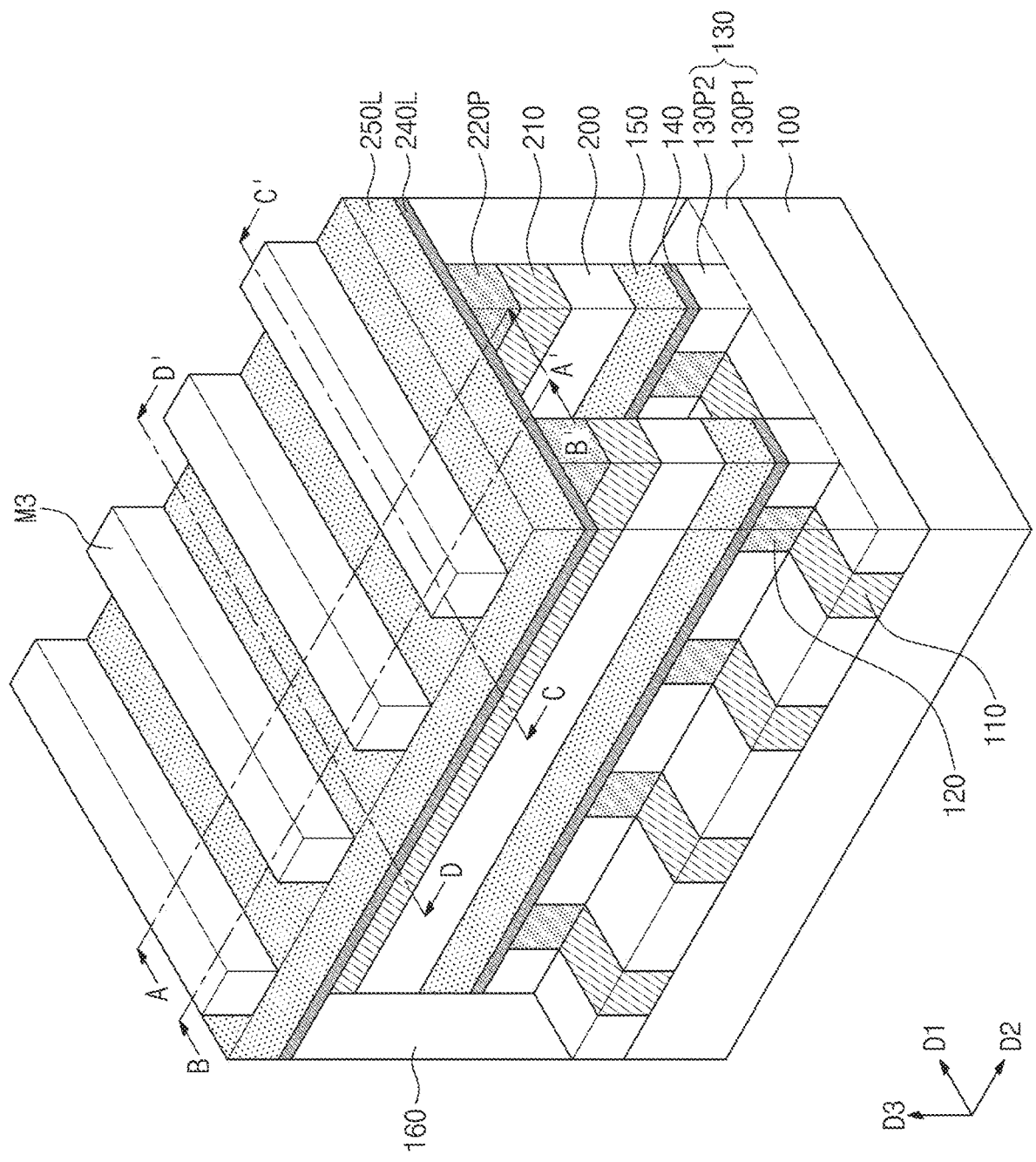
Figure 18A:
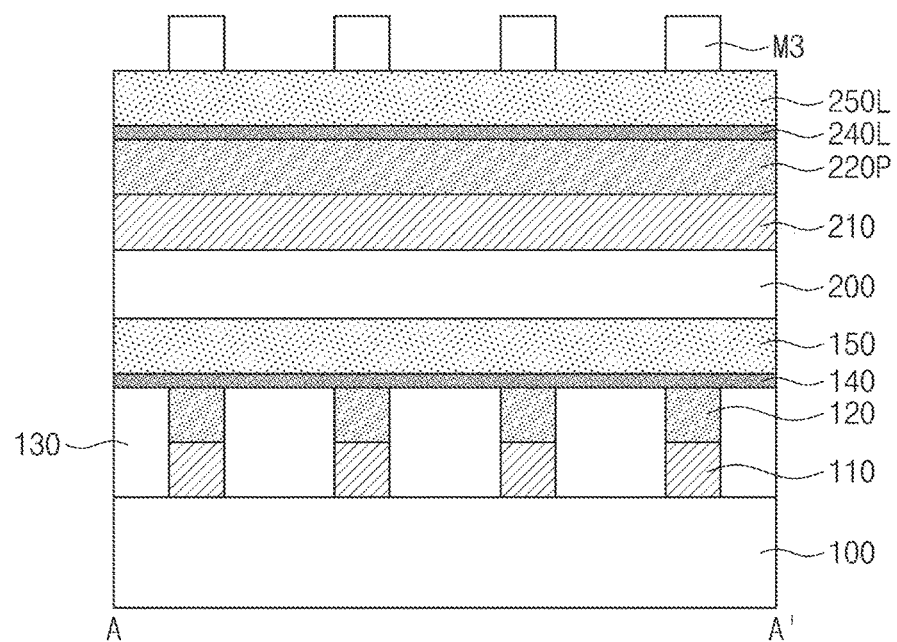
Figure 18A:
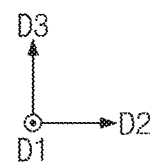
Figure 18B:
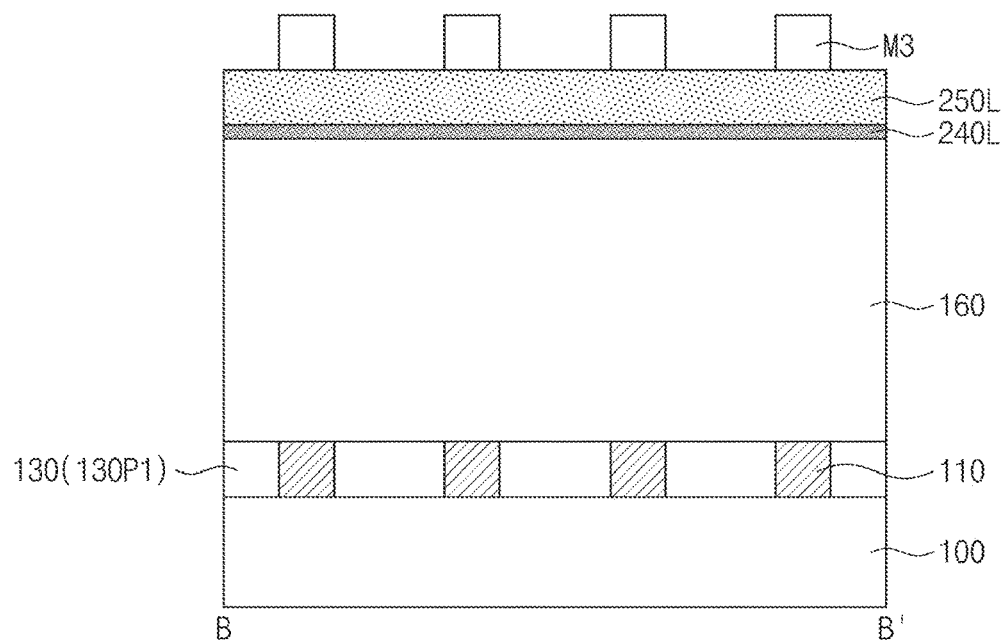
Figure 18B:
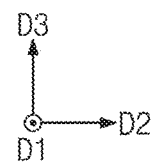
Figure 18C:
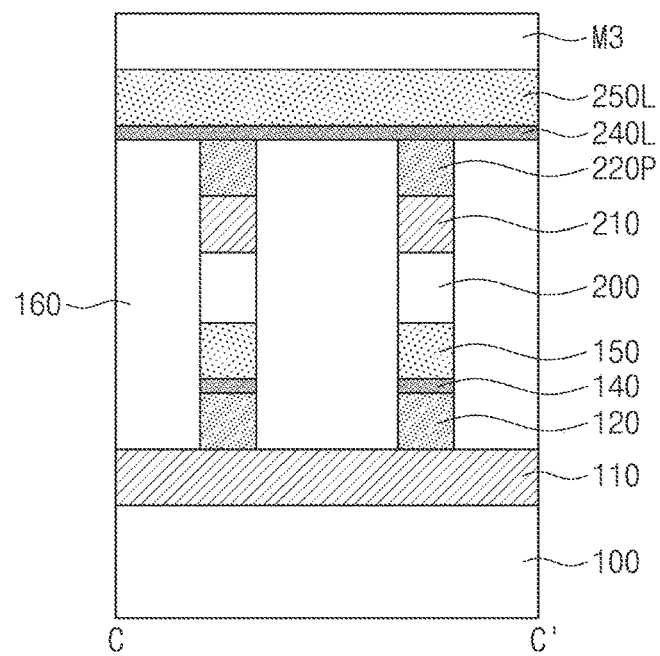
Figure 18C:
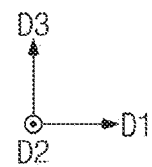
Figure 18D:
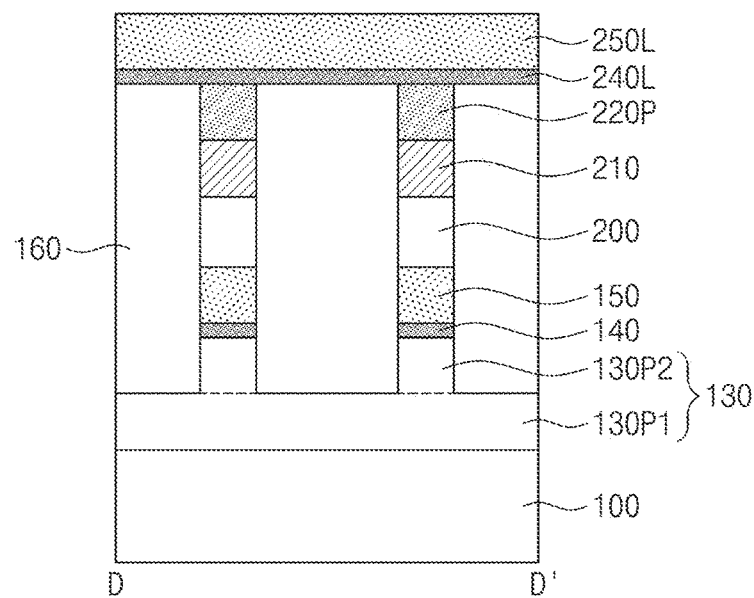
Figure 18D:
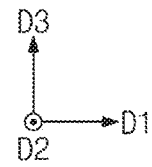
Figure 19:
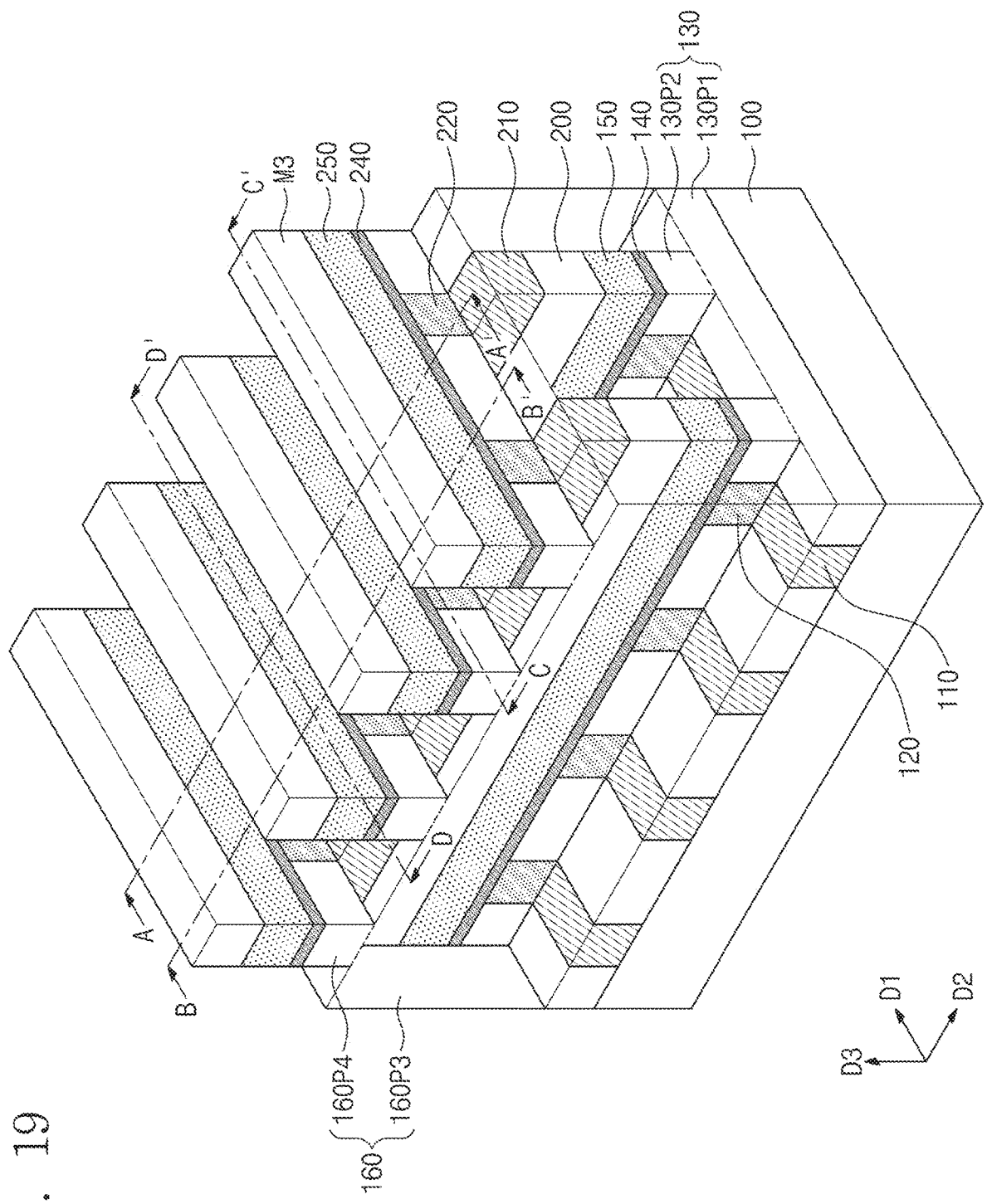
Figure 20A:
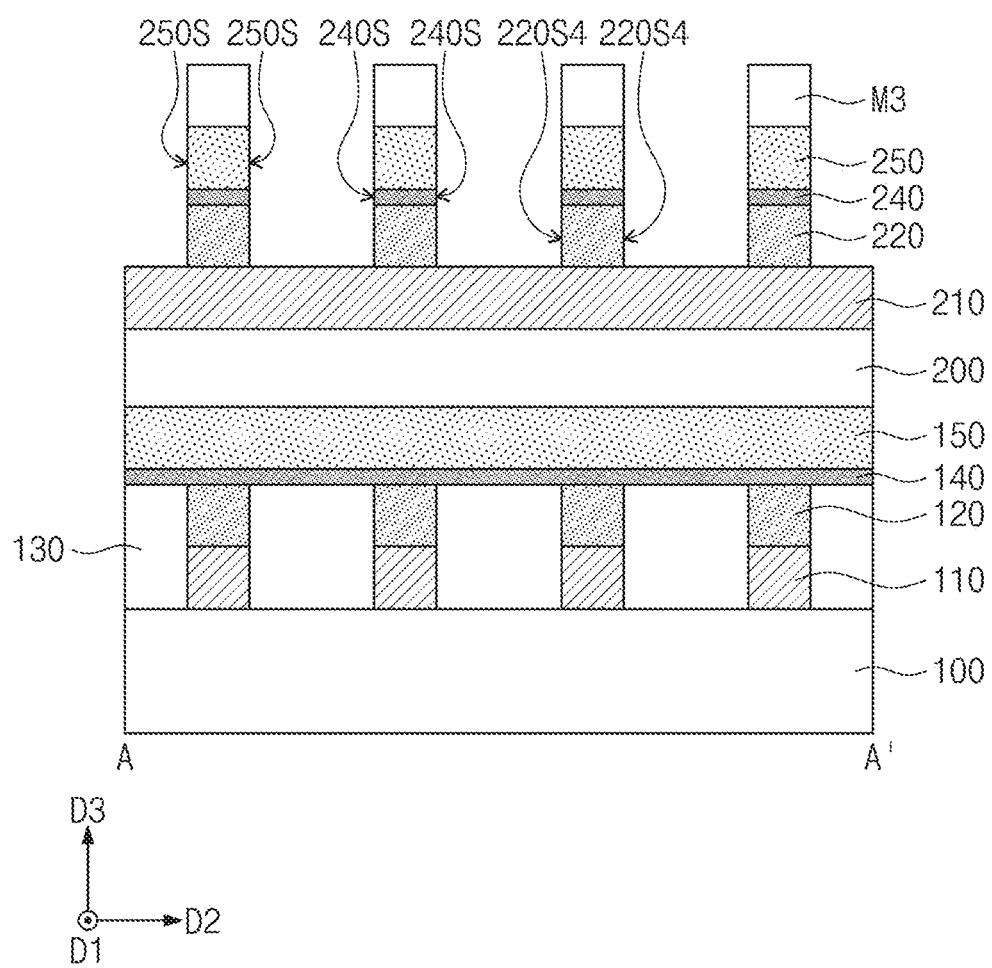
Figure 20B:
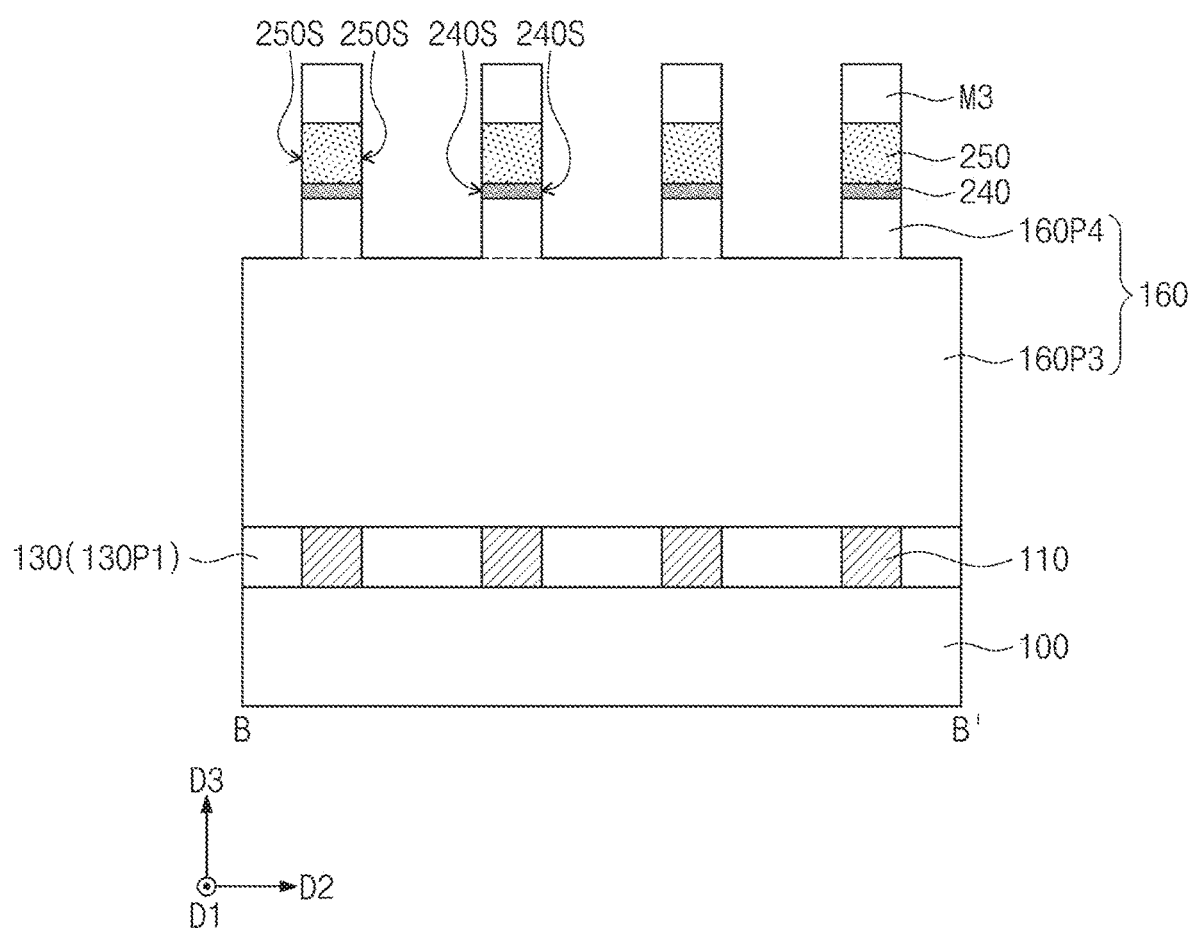
Figure 20C:
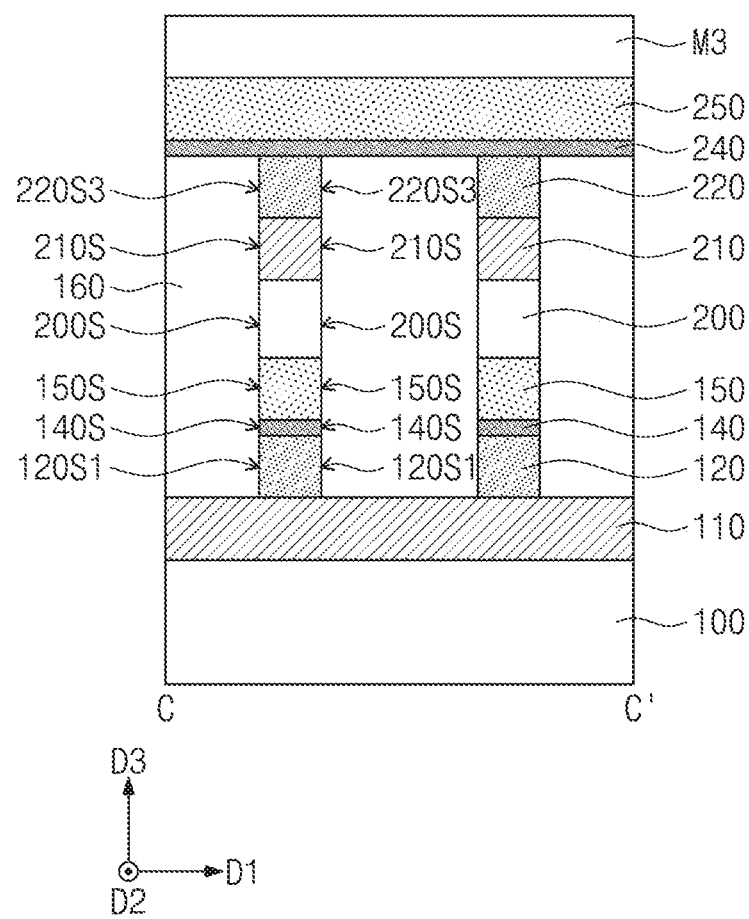
Figure 20D:
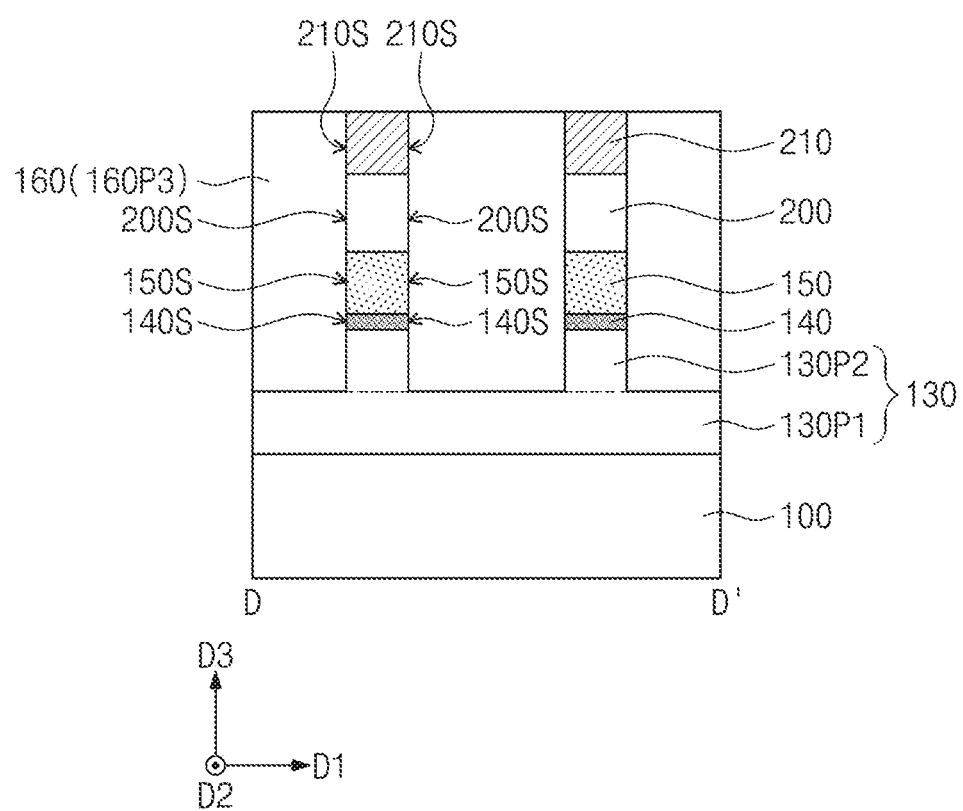

FIG. 11 is a perspective view schematically illustrating a magnetic memory device according to some embodiments of the inventive concepts. FIGS. 12A, 12B, 12C and 12D are cross-sectional views taken along lines A-A', B-B', C-C' and D-D' of FIG. 11, respectively. Hereinafter, differences between the present embodiments and the embodiments of FIGS. 1 and 2A to 2F will be mainly described for ease and convenience in explanation.

Referring to FIGS. 11 and 12A to 12D, a plurality of first conductive lines 110 may be disposed on a substrate 100. A plurality of first magnetic lines 150 may be disposed on the first conductive lines 110 and may intersect the first conductive lines 110. The first magnetic lines 150 may be vertically spaced apart from the first conductive lines 110 in the third direction D3. A plurality of first magnetic patterns 120 may be disposed between the first conductive lines 110 and the first magnetic lines 150 and may be located at intersection points or respective intersections of the first conductive lines 110 and the first magnetic lines 150, respectively. A plurality of first tunnel barrier lines 140 may be disposed between the first conductive lines 110 and the first magnetic lines 150 and may intersect the first conductive lines 110. Each of the first tunnel barrier lines 140 may be disposed between a corresponding one of the first magnetic lines 150 and corresponding ones of the first magnetic patterns 120. The corresponding first magnetic patterns 120 may be spaced apart from each other in the second direction D2 and may be connected to the first conductive lines 110, respectively.

Each of the first magnetic patterns 120 may have first sidewalls 120S1 opposite to each other in the first direction D1, and second sidewalls 120S2 opposite to each other in the second direction D2. The second sidewalls 120S2 of each of the first magnetic patterns 120 may be aligned with opposing sidewalls 110S of a corresponding one of the first conductive lines 110, respectively. The first sidewalls 120S1 of each of the first magnetic patterns 120 may be aligned with opposing sidewalls 140S of a corresponding one of the first tunnel barrier lines 140, respectively, and may be aligned with opposing sidewalls 150S of a corresponding one of the first magnetic lines 150, respectively.

The first conductive lines 110, the first magnetic patterns 120, the first tunnel barrier lines 140 and the first magnetic lines 150 may be substantially the same as the conductive lines 110, the magnetic patterns 120, the tunnel barrier lines 140 and the magnetic lines 150, described with reference to FIGS. 1 and 2A to 2F.

A first interlayer insulating layer 130 may be disposed on the substrate 100 to cover the first conductive lines 110 and the first magnetic patterns 120. The first interlayer insulating layer 130 may include a first portion 130P1 disposed between the first conductive lines 110, and a second portion 130P2 disposed between the first magnetic patterns 120. The second portion 130P2 of the first interlayer insulating layer 130 may be disposed between the first magnetic patterns 120 arranged in the second direction D2. The first portion 130P1 of the first interlayer insulating layer 130 may cover the sidewalls 110S of the first conductive lines 110 and may expose top surfaces of the first conductive lines 110. The second portion 130P2 of the first interlayer insulating layer 130 may cover the second sidewalls 120S2 of the first magnetic patterns 120 and may expose the first sidewalls 120S1 of the first magnetic patterns 120.

A plurality of separation insulating lines 200 may be disposed on the first magnetic lines 150, respectively. The separation insulating lines 200 may extend in the second direction D2 and may be spaced apart from each other in the first direction D1. The first magnetic lines 150 may be disposed between the first tunnel barrier lines 140 and the separation insulating lines 200. The sidewalls 150S of the first magnetic lines 150 may be aligned with sidewalls 200S of the separation insulating lines 200, respectively. The separation insulating lines 200 may include at least one of silicon oxide, silicon nitride, or silicon oxynitride.

A plurality of second conductive lines 210 may be disposed on the separation insulating lines 200, respectively. The second conductive lines 210 may extend in the second direction D2 and may be spaced apart from each other in the first direction D1. The separation insulating lines 200 may be disposed between the first magnetic lines 150 and the second conductive lines 210. The second conductive lines 210 may extend in parallel to the first magnetic lines 150. The sidewalls 200S of the separation insulating lines 200 may be aligned with sidewalls 210S of the second conductive lines 210, respectively. The second conductive lines 210 may be electrically insulated from the first magnetic lines 150 by the separation insulating lines 200. The second conductive lines 210 may be non-magnetic and may include a non-magnetic metal. The second conductive lines 210 may include a metal (e.g., copper, tungsten, or aluminum) and/or a metal nitride (e.g., tantalum nitride, titanium nitride, or tungsten nitride). In some embodiments, the second conductive lines 210 may include the same material as the first conductive lines 110.

A plurality of second magnetic lines 250 may be disposed on the second conductive lines 210 and may intersect the second conductive lines 210. The second magnetic lines 250 may extend in the first direction D1 and may be spaced apart from each other in the second direction D2. The second magnetic lines 250 may be vertically spaced apart from the second conductive lines 210 in the third direction D3.

Each of the second magnetic lines 250 may include a plurality of magnetic domains D and a plurality of magnetic domain walls DW. In each of the second magnetic lines 250, the magnetic domains D and the magnetic domain walls DW may be alternately and repeatedly arranged in the first direction D1. The second magnetic lines 250 may include at least one of cobalt (Co), iron (Fe), or nickel (Ni). In some embodiments, the second magnetic lines 250 may include the same material as the first magnetic lines 150.

A plurality of second magnetic patterns 220 may be disposed between the second conductive lines 210 and the second magnetic lines 250 and may be located at intersection points or respective intersections of the second conductive lines 210 and the second magnetic lines 250, respectively. The second magnetic patterns 220 may be two-dimensionally arranged in the first direction D1 and the second direction D2. Each of the second magnetic patterns 220 may be electrically connected to a corresponding one of the second conductive lines 210. The second magnetic patterns 220 may include at least one of cobalt (Co), iron (Fe), or nickel (Ni). In some embodiments, the second magnetic patterns 220 may include the same material as the first magnetic patterns 120.

A plurality of second tunnel barrier lines 240 may be disposed between the second conductive lines 210 and the second magnetic lines 250, and may intersect the second conductive lines 210. The second tunnel barrier lines 240 may extend in the first direction D1 and may be spaced apart from each other in the second direction D2. Each of the second tunnel barrier lines 240 may be disposed between a corresponding one of the second magnetic lines 250 and corresponding ones of the second magnetic patterns 220. The corresponding second magnetic patterns 220 may be spaced apart from each other in the first direction D1 and may be connected to the second conductive lines 210, respectively. The second tunnel barrier lines 240 may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer. In some embodiments, the second tunnel barrier lines 240 may include the same material as the first tunnel barrier lines 140.

Each of the second magnetic patterns 220 may have third sidewalls 220S3 opposite to each other in the first direction D1, and fourth sidewalls 220S4 opposite to each other in the second direction D2. The third sidewalls 220S3 of each of the second magnetic patterns 220 may be aligned with opposing sidewalls 210S of a corresponding one of the second conductive lines 210, respectively. The fourth sidewalls 220S4 of each of the second magnetic patterns 220 may be aligned with opposing sidewalls 240S of a corresponding one of the second tunnel barrier lines 240, respectively, and may be aligned with opposing sidewalls 250S of a corresponding one of the second magnetic lines 250, respectively. The sidewalls 240S of the second tunnel barrier lines 240 may be aligned with the sidewalls 250S of the second magnetic lines 250.

A second interlayer insulating layer 160 may be disposed on the first interlayer insulating layer 130 and may cover the first sidewalls 120S1 of the first magnetic patterns 120 and the top surfaces of the first conductive lines 110. The second interlayer insulating layer 160 may extend between the first tunnel barrier lines 140, between the first magnetic lines 150, between the separation insulating lines 200, and between the second conductive lines 210. The second interlayer insulating layer 160 may cover the sidewalls 140S of the first tunnel barrier lines 140, the sidewalls 150S of the first magnetic lines 150, the sidewalls 200S of the separation insulating lines 200, and the sidewalls 210S of the second conductive lines 210.

The second interlayer insulating layer 160 may include a third portion 160P3 disposed between the second conductive lines 210, and a fourth portion 160P4 protruding from the third portion 160P3 in the third direction D3 and disposed between the second magnetic patterns 220. The third portion 160P3 of the second interlayer insulating layer 160 may extend between the separation insulating lines 200, between the first magnetic lines 150 and between the first tunnel barrier lines 140 and may cover the first sidewalls 120S1 of the first magnetic patterns 120 and the top surfaces of the first conductive lines 110. The third portion 160P3 of the second interlayer insulating layer 160 may expose top surfaces of the second conductive lines 210. A top surface of the third portion 160P3 of the second interlayer insulating layer 160 may be substantially coplanar with the top surfaces of the second conductive lines 210. For example, the top surface of the third portion 160P3 of the second interlayer insulating layer 160 may be located at substantially the same height (relative to the substrate 100) as the top surfaces of the second conductive lines 210.

The fourth portion 160P4 of the second interlayer insulating layer 160 may be disposed between the second magnetic patterns 220 arranged in the first direction D1. The fourth portion 160P4 of the second interlayer insulating layer 160 may cover the third sidewalls 220S3 of the second magnetic patterns 220 and may expose the fourth sidewalls 220S4 of the second magnetic patterns 220. For example, the second interlayer insulating layer 160 may include at least one of silicon oxide, silicon nitride, or silicon oxynitride.

A third interlayer insulating layer 170 may be disposed on the second interlayer insulating layer 160 and may cover the fourth sidewalls 220S4 of the second magnetic patterns 220 and the top surfaces of the second conductive lines 210. The third interlayer insulating layer 170 may extend between the second tunnel barrier lines 240 and between the second magnetic lines 250. The third interlayer insulating layer 170 may cover the sidewalls 240S of the second tunnel barrier lines 240 and the sidewalls 250S of the second magnetic lines 250. For example, the third interlayer insulating layer 170 may include at least one of silicon oxide, silicon nitride, or silicon oxynitride.

The first conductive lines 110, the first magnetic patterns 120, the first tunnel barrier lines 140 and the first magnetic lines 150 may constitute a first cell stack, and the second conductive lines 210, the second magnetic patterns 220, the second tunnel barrier lines 240 and the second magnetic lines 250 may constitute a second cell stack. A magnetic memory device according to the present embodiments may include the first cell stack and the second cell stack which are sequentially stacked on the substrate 100. However, embodiments of the inventive concepts are not limited thereto. The magnetic memory device may further include one or more additional cell stacks stacked on the second cell stack. Except that the extending directions of the second conductive lines 210, the second tunnel barrier lines 240 and the second magnetic lines 250 are different from the extending directions of the first conductive lines 110, the first tunnel barrier lines 140 and the first magnetic lines 150, other features and components of the second cell stack may be substantially the same as corresponding features and components of the first cell stack. The second cell stack may operate (e.g., read/write operations) by substantially the same method as the first cell stack.

FIGS. 13, 15, 17 and 19 are perspective views illustrating a method for manufacturing a magnetic memory device according to some embodiments of the inventive concepts. FIGS. 14A, 16A, 18A and 20A are cross-sectional views taken along lines A-A' of FIGS. 13, 15, 17 and 19, respectively, and FIGS. 14B, 16B, 18B and 20B are cross-sectional views taken along lines B-B' of FIGS. 13, 15, 17 and 19, respectively. FIGS. 14C, 16C, 18C and 20C are cross-sectional views taken along lines C-C' of FIGS. 13, 15, 17 and 19, respectively, and FIGS. 14D, 16D, 18D and 20D are cross-sectional views taken along lines D-D' of FIGS. 13, 15, 17 and 19, respectively. Hereinafter, the descriptions to the same features as mentioned with reference to FIGS. 3 to 10D will be omitted for ease and convenience in explanation.

Referring to FIGS. 13 and 14A to 14D, first conductive lines 110 and first preliminary magnetic patterns 120P may be formed on a substrate 100. The first conductive lines 110 and the first preliminary magnetic patterns 120P may be formed by substantially the same method as the conductive lines 110 and the preliminary magnetic patterns 120P, described with reference to FIGS. 3 and 4A to 4D. For example, the formation of the first conductive lines 110 and the first preliminary magnetic patterns 120P may include sequentially forming a first conductive layer and a first magnetic layer on the substrate 100, forming first mask patterns on the first magnetic layer, and performing a first etching process of sequentially etching the first magnetic layer and the first conductive layer by using the first mask patterns as etch masks. Since the first preliminary magnetic patterns 120P are formed using the same mask patterns (i.e., the first mask patterns M1) as the first conductive lines 110, sidewalls 120PS of the first preliminary magnetic patterns 120P may be aligned with sidewalls 110S of the first conductive lines 110.

A first interlayer insulating layer 130 may be formed on the substrate 100 to cover the first preliminary magnetic patterns 120P and the first conductive lines 110. For example, the formation of the first interlayer insulating layer 130 may include forming a first insulating layer covering the first mask patterns, the first preliminary magnetic patterns 120P and the first conductive lines 110 on the substrate 100, and planarizing the first insulating layer until top surfaces of the first preliminary magnetic patterns 120P are exposed. The first mask patterns may be removed during the planarization of the first insulating layer.

A first tunnel barrier layer 140L, a second magnetic layer 150L, a separation insulating layer 200L, a second conductive layer 210L and a third magnetic layer 220L may be sequentially formed on the first interlayer insulating layer 130. The first tunnel barrier layer 140L and the second magnetic layer 150L may be formed by substantially the same method as the tunnel barrier layer 140L and the second magnetic layer 150L, described with reference to FIGS. 7 and 8A to 8D. The separation insulating layer 200L may be formed using, for example, a CVD method and may be disposed between the second magnetic layer 150L and the second conductive layer 210L. The second conductive layer 210L and the third magnetic layer 220L may be formed using a CVD method or a PVD method (e.g., a sputtering deposition method).

Second mask patterns M2 may be formed on the third magnetic layer 220L. The second mask patterns M2 may have linear or line shapes extending in the second direction D2 and may be spaced apart from each other in the first direction D1. The second mask patterns M2 may include a material having an etch selectivity with respect to the first tunnel barrier layer 140L, the second magnetic layer 150L, the separation insulating layer 200L, the second conductive layer 210L, and the third magnetic layer 220L. For example, the second mask patterns M2 may include silicon oxide, silicon nitride, and/or silicon oxynitride.

Referring to FIGS. 15 and 16A to 16D, the third magnetic layer 220L, the second conductive layer 210L, the separation insulating layer 200L, the second magnetic layer 150L and the first tunnel barrier layer 140L may be etched by a second etching process using the second mask patterns M2 as etch masks. The third magnetic layer 220L, the second conductive layer 210L, the separation insulating layer 200L, the second magnetic layer 150L and the first tunnel barrier layer 140L may be sequentially etched by the second etching process, thereby forming second preliminary magnetic patterns 220P, second conductive lines 210, separation insulating lines 200, first magnetic lines 150, and first tunnel barrier lines 140.

The first magnetic lines 150 may extend in the second direction D2 to intersect the first preliminary magnetic patterns 120P and may be spaced apart from each other in the first direction D1. The first tunnel barrier lines 140 may extend in the second direction D2 between the first magnetic lines 150 and the first preliminary magnetic patterns 120P to intersect the first preliminary magnetic patterns 120P and may be spaced apart from each other in the first direction D1. The separation insulating lines 200 may be formed on the first magnetic lines 150, respectively. The separation insulating lines 200 may extend in the second direction D2 and may be spaced apart from each other in the first direction D1. The second conductive lines 210 may be formed on the separation insulating lines 200, respectively. The second conductive lines 210 may extend in the second direction D2 and may be spaced apart from each other in the first direction D1. The second preliminary magnetic patterns 220P may be formed on the second conductive lines 210, respectively. The second preliminary magnetic patterns 220P may extend in the second direction D2 and may be spaced apart from each other in the first direction D1. The second preliminary magnetic patterns 220P, the second conductive lines 210, the separation insulating lines 200, the first magnetic lines 150 and the first tunnel barrier lines 140 may be formed using the same mask patterns (i.e., the second mask patterns M2), and thus sidewalls 220PS of the second preliminary magnetic patterns 220P, sidewalls 210S of the second conductive lines 210, sidewalls 200S of the separation insulating lines 200, sidewalls 150S of the first magnetic lines 150 and sidewalls 140S of the first tunnel barrier lines 140 may be aligned with each other.

Portions of the first preliminary magnetic patterns 120P, which are disposed at opposing sides of each of the first magnetic lines 150, may be etched by the second etching process. The second etching process may be performed until the top surfaces of the first conductive lines 110 at opposing sides of each of the first magnetic lines 150 are exposed. The first conductive lines 110 may function as an etch stop layer in the second etching process. Since the first preliminary magnetic patterns 120P are patterned by the second etching process, first magnetic patterns 120 may be formed under each of the first magnetic lines 150. The first magnetic patterns 120 may be spaced apart from each other in the second direction D2 under each of the first magnetic lines 150. Each of the first tunnel barrier lines 140 may be disposed between a corresponding one of the first magnetic lines 150 and corresponding ones of the first magnetic patterns 120. The first magnetic patterns 120 may be locally formed at intersection points or respective intersections of each of the first magnetic lines 150 and the first conductive lines 110.

Each of the first magnetic patterns 120 may have first sidewalls 120S1 opposite to each other in the first direction D1, and second sidewalls 120S2 opposite to each other in the second direction D2. Since the first preliminary magnetic patterns 120P are formed using the same mask patterns (i.e., the first mask patterns M1) as the first conductive lines 110, the second sidewalls 120S2 of each of the first magnetic patterns 120 may be aligned with opposing sidewalls 110S of a corresponding one of the first conductive lines 110, respectively. In addition, since the first magnetic patterns 120 are formed using the same mask patterns (i.e., the second mask patterns M2) as the first magnetic lines 150 and the first tunnel barrier lines 140, the first sidewalls 120S1 of each of the first magnetic patterns 120 may be aligned with opposing sidewalls 140S of a corresponding one of the first tunnel barrier lines 140, respectively, and may be aligned with opposing sidewalls 150S of a corresponding one of the first magnetic lines 150, respectively.

Portions of the first interlayer insulating layer 130, which are disposed at opposing sides of each of the first magnetic lines 150, may be etched by the second etching process. Since the first interlayer insulating layer 130 is patterned by the second etching process, the first interlayer insulating layer 130 may include a first portion 130P1 disposed between the first conductive lines 110, and a second portion 130P2 disposed between the first magnetic patterns 120. The first portion 130P1 of the first interlayer insulating layer 130 may cover the sidewalls 110S of the first conductive lines 110 and may expose the top surfaces of the first conductive lines 110. The second portion 130P2 of the first interlayer insulating layer 130 may cover the second sidewalls 120S2 of the first magnetic patterns 120 and may expose the first sidewalls 120S1 of the first magnetic patterns 120.

Referring to FIGS. 17 and 18A to 18D, a second interlayer insulating layer 160 may be formed on the first interlayer insulating layer 130 and may cover the first sidewalls 120S1 of each of the first magnetic patterns 120 and the top surfaces of the first conductive lines 110. The second interlayer insulating layer 160 may cover the sidewalls of the second preliminary magnetic patterns 220P, the second conductive lines 210, the separation insulating lines 200, the first magnetic lines 150 and the first tunnel barrier lines 140. For example, the formation of the second interlayer insulating layer 160 may include forming a second insulating layer covering the first conductive lines 110, the first magnetic patterns 120, the first tunnel barrier lines 140, the first magnetic lines 150, the separation insulating lines 200, the second conductive lines 210, the second preliminary magnetic patterns 220P and the second mask patterns M2 on the first interlayer insulating layer 130, and planarizing the second insulating layer until top surfaces of the second preliminary magnetic patterns 220P are exposed. The second mask patterns M2 may be removed during the planarization of the second insulating layer.

A second tunnel barrier layer 240L and a fourth magnetic layer 250L may be sequentially formed on the second interlayer insulating layer 160. The second tunnel barrier layer 240L may cover the exposed top surfaces of the second preliminary magnetic patterns 220P and a top surface of the second interlayer insulating layer 160. The second tunnel barrier layer 240L may be disposed between the fourth magnetic layer 250L and the second preliminary magnetic patterns 220P and between the fourth magnetic layer 250L and the second interlayer insulating layer 160. The second tunnel barrier layer 240L and the fourth magnetic layer 250L may be formed using a CVD method or a PVD method (e.g., a sputtering deposition method). The fourth magnetic layer 250L may include a plurality of magnetic domains and a plurality of magnetic domain walls.

Third mask patterns M3 may be formed on the fourth magnetic layer 250L. The third mask patterns M3 may have linear or line shapes extending in the first direction D1 and may be spaced apart from each other in the second direction D2. The third mask patterns M3 may include a material having an etch selectivity with respect to the second tunnel barrier layer 240L and the fourth magnetic layer 250L. For example, the third mask patterns M3 may include silicon oxide, silicon nitride, and/or silicon oxynitride.

Referring to FIGS. 19 and 20A to 20D, the fourth magnetic layer 250L, the second tunnel barrier layer 240L, the second preliminary magnetic patterns 220P and the second interlayer insulating layer 160 may be etched by a third etching process using the third mask patterns M3 as etch masks. The fourth magnetic layer 250L and the second tunnel barrier layer 240L may be sequentially etched by the third etching process, and thus second magnetic lines 250 and second tunnel barrier lines 240 may be formed. The second magnetic lines 250 may extend in the first direction D1 to intersect the second preliminary magnetic patterns 220P and may be spaced apart from each other in the second direction D2. The second tunnel barrier lines 240 may extend in the first direction D1 between the second magnetic lines 250 and the second preliminary magnetic patterns 220P to intersect the second preliminary magnetic patterns 220P and may be spaced apart from each other in the second direction D2. Since the second tunnel barrier lines 240 are formed using the same mask patterns (i.e., the third mask patterns M3) as the second magnetic lines 250, sidewalls 240S of the second tunnel barrier lines 240 may be aligned with sidewalls 250S of the second magnetic lines 250.

Portions of the second preliminary magnetic patterns 220P, which are disposed at opposing sides of each of the second magnetic lines 250, may be etched by the third etching process. The third etching process may be performed until top surfaces of the second conductive lines 210 at opposing sides of each of the second magnetic lines 250 are exposed. The second conductive lines 210 may function as an etch stop layer in the third etching process. Since the second preliminary magnetic patterns 220P are patterned by the third etching process, second magnetic patterns 220 may be formed under each of the second magnetic lines 250. The second magnetic patterns 220 may be spaced apart from each other in the first direction D1 under each of the second magnetic lines 250. Each of the second tunnel barrier lines 240 may be disposed between a corresponding one of the second magnetic lines 250 and corresponding ones of the second magnetic patterns 220. The second magnetic patterns 220 may be locally formed at intersection points or respective intersections of each of the second magnetic lines 250 and the second conductive lines 210.

Each of the second magnetic patterns 220 may have third sidewalls 220S3 opposite to each other in the first direction D1, and fourth sidewalls 220S4 opposite to each other in the second direction D2. Since the second preliminary magnetic patterns 220P are formed using the same mask patterns (i.e., the second mask patterns M2) as the second conductive lines 210, the third sidewalls 220S3 of each of the second magnetic patterns 220 may be aligned with opposing sidewalls 210S of a corresponding one of the second conductive lines 210, respectively. In addition, since the second magnetic patterns 220 are formed using the same mask patterns (i.e., the third mask patterns M3) as the second magnetic lines 250 and the second tunnel barrier lines 240, the fourth sidewalls 220S4 of each of the second magnetic patterns 220 may be aligned with opposing sidewalls 240S of a corresponding one of the second tunnel barrier lines 240, respectively, and may be aligned with opposing sidewalls 250S of a corresponding one of the second magnetic lines 250, respectively.

Portions of the second interlayer insulating layer 160, which are disposed at opposing sides of each of the second magnetic lines 250, may be etched by the third etching process. Since the second interlayer insulating layer 160 is patterned by the third etching process, the second interlayer insulating layer 160 may include a third portion 160P3 disposed between the second conductive lines 210, and a fourth portion 160P4 disposed between the second magnetic patterns 220. The third portion 160P3 of the second interlayer insulating layer 160 may cover the sidewalls 210S of the second conductive lines 210 and may expose the top surfaces of the second conductive lines 210. The fourth portion 160P4 of the second interlayer insulating layer 160 may cover the third sidewalls 220S3 of the second magnetic patterns 220 and may expose the fourth sidewalls 220S4 of the second magnetic patterns 220.

Referring again to FIGS. 11 and 12A to 12D, a third interlayer insulating layer 170 may be formed on the second interlayer insulating layer 160 and may cover the fourth sidewalls 220S4 of each of the second magnetic patterns 220 and the top surfaces of the second conductive lines 210. The third interlayer insulating layer 170 may be formed to cover the sidewalls 240S of the second tunnel barrier lines 240 and the sidewalls 250S of the second magnetic lines 250. For example, the formation of the third interlayer insulating layer 170 may include forming a third insulating layer covering the second conductive lines 210, the second magnetic patterns 220, the second tunnel barrier lines 240, the second magnetic lines 250 and the third mask patterns M3 on the second interlayer insulating layer 160, and planarizing the third insulating layer until top surfaces of the second magnetic lines 250 are exposed. The third mask patterns M3 may be removed during the planarization of the third insulating layer.

According to embodiments of the inventive concepts, the first magnetic patterns 120 may be self-aligned at the intersection points or respective intersections of the first magnetic lines 150 and the first conductive lines 110, and the second magnetic patterns 220 may be self-aligned at the intersection points or respective intersections of the second magnetic lines 250 and the second conductive lines 210. In addition, additional mask patterns for forming the first and second magnetic patterns 120 and 220 may not be required. As a result, processes for manufacturing a highly integrated magnetic memory device may be simplified, and thus the mass production of the highly integrated magnetic memory device may be easy.

According to embodiments of the inventive concepts, processes for manufacturing a magnetic memory device may be simplified, and thus higher integration density and mass production of the magnetic memory device may be more easily realized.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A magnetic memory device comprising:
a conductive line extending in a first direction;
a magnetic line extending in a second direction intersecting the first direction on the conductive line, the magnetic line intersecting the conductive line and extending beyond the conductive line in the second direction; and
a magnetic pattern between the conductive line and the magnetic line,
wherein the magnetic pattern comprises first sidewalls opposite to each other in the first direction, and second sidewalls opposite to each other in the second direction, and wherein the second sidewalls of the magnetic pattern are aligned with opposing sidewalls of the conductive line, respectively.

2. The magnetic memory device of claim 1, wherein the magnetic pattern is at an intersection of the conductive line and the magnetic line.

3. The magnetic memory device of claim 2, wherein the magnetic line comprises:
a plurality of magnetic domains and a plurality of magnetic domain walls alternately arranged in the second direction, and
wherein the magnetic pattern is electrically connected to the conductive line and has a magnetization direction that is fixed in one direction.

4. The magnetic memory device of claim 2, further comprising:
a tunnel barrier line between the magnetic line and the magnetic pattern and extending in the second direction to intersect the conductive line,
wherein the first sidewalls of the magnetic pattern are aligned with opposing sidewalls of the tunnel barrier line, respectively.

5. The magnetic memory device of claim 4, wherein the opposing sidewalls of the tunnel barrier line are aligned with opposing sidewalls of the magnetic line, respectively.

6. The magnetic memory device of claim 1, wherein the conductive line is non-magnetic.

7. The magnetic memory device of claim 1, further comprising:
a first interlayer insulating layer on the conductive line and the magnetic pattern,
wherein the first interlayer insulating layer comprises:
a first portion on the opposing sidewalls of the conductive line; and
a second portion protruding from the first portion and extending on the second sidewalls of the magnetic pattern,
wherein a top surface of the first portion is substantially coplanar with a top surface of the conductive line, and
wherein the second portion exposes the first sidewalls of the magnetic pattern.

8. The magnetic memory device of claim 7, further comprising:
a second interlayer insulating layer on the first interlayer insulating layer,
wherein the second interlayer insulating layer extends on the top surface of the conductive line and the first sidewalls of the magnetic pattern, and extends on sidewalls of the magnetic line.

9. The magnetic memory device of claim 7, further comprising:
a tunnel barrier line between the magnetic line and the magnetic pattern,
wherein the tunnel barrier line extends between the second portion of the first interlayer insulating layer and the magnetic line.

10. The magnetic memory device of claim 1, wherein the conductive line is a first conductive line, and further comprising:
a second conductive line extending along the second direction, wherein the second conductive line is vertically spaced apart from the magnetic line.

11. A magnetic memory device comprising:
a first conductive line extending in a first direction;
a first magnetic line extending in a second direction intersecting the first direction on the first conductive line, the first magnetic line intersecting the first conductive line;
a first magnetic pattern between the first conductive line and the first magnetic line;
a second conductive line extending along the second direction on the first magnetic line;
a second magnetic line extending in the first direction on the second conductive line and intersecting the second conductive line; and
a second magnetic pattern between the second conductive line and the second magnetic line,
wherein the second conductive line is vertically spaced apart from the first magnetic line, and
wherein the first conductive line and the second conductive line are non-magnetic.

12. The magnetic memory device of claim 11, wherein the first magnetic pattern is at an intersection of the first conductive line and the first magnetic line and is electrically connected to the first conductive line, and
wherein the second magnetic pattern is at an intersection of the second conductive line and the second magnetic line and is electrically connected to the second conductive line.

13. The magnetic memory device of claim 11, further comprising:
a first tunnel barrier line between the first magnetic line and the first magnetic pattern and extending in the second direction to intersect the first conductive line; and
a second tunnel barrier line between the second magnetic line and the second magnetic pattern and extending in the first direction to intersect the second conductive line.

14. The magnetic memory device of claim 11, wherein the first magnetic line comprises a plurality of first magnetic domains and a plurality of first magnetic domain walls alternately arranged in the second direction, and
wherein the second magnetic line comprises a plurality of second magnetic domains and a plurality of second magnetic domain walls alternately arranged in the first direction.

15. The magnetic memory device of claim 14, wherein each of the first and second magnetic patterns has a respective magnetization direction that is fixed in a respective direction.

16. The magnetic memory device of claim 11, further comprising:
a separation insulating line extending along the second direction between the first magnetic line and the second conductive line.

17. A magnetic memory device comprising:
conductive lines extending in a first direction and spaced apart from each other in a second direction intersecting the first direction;
magnetic lines extending in the second direction on the conductive lines and spaced apart from each other in the first direction, the magnetic lines intersecting the conductive lines and extending beyond the conductive lines in the second direction;
magnetic patterns at intersections of the conductive lines and the magnetic lines, respectively; and
tunnel barrier lines between the conductive lines and the magnetic lines, extending in the second direction and spaced apart from each other in the first direction, wherein each of the tunnel barrier lines is between a corresponding one of the magnetic lines and corresponding ones of the magnetic patterns, wherein each of the magnetic patterns comprises first sidewalls opposite to each other in the first direction, and second sidewalls opposite to each other in the second direction, and wherein the second sidewalls of each of the magnetic patterns are aligned with sidewalls of a corresponding one of the conductive lines.

18. The magnetic memory device of claim 17, wherein each of the magnetic lines comprises a plurality of magnetic domains and a plurality of magnetic domain walls alternately arranged in the second direction.

19. The magnetic memory device of claim 18, wherein each of the magnetic patterns has a respective magnetization direction that is fixed in a respective direction, and wherein each of the plurality of magnetic domains has a respective magnetization direction that is changeable to be parallel or anti-parallel to the respective magnetization direction of a corresponding one of the magnetic patterns.

20. The magnetic memory device of claim 17, wherein the first sidewalls of each of the magnetic patterns are aligned with opposing sidewalls of a corresponding one of the tunnel barrier lines.

21. The magnetic memory device of claim 20, wherein the opposing sidewalls of the corresponding one of the tunnel barrier lines are aligned with opposing sidewalls of the corresponding one of the magnetic lines, respectively.

22. The magnetic memory device of claim 17, wherein the conductive lines are first conductive lines, and further comprising:

second conductive lines extending along the second direction, wherein the second conductive lines are vertically spaced apart from the magnetic lines.

* * * * *